United States Patent
Li et al.

(10) Patent No.: US 12,442,101 B2
(45) Date of Patent: Oct. 14, 2025

(54) ELECTROPLATING METHOD FOR ENHANCING THE PERFORMANCE OF ROLLED-UP PASSIVE COMPONENTS

(71) Applicant: The Board of Trustees of the University of Illinois, Urbana, IL (US)

(72) Inventors: Xiuling Li, Austin, TX (US); Apratim Khandelwal, Champaign, IL (US); Zhendong Yang, Austin, TX (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 1032 days.

(21) Appl. No.: 17/503,603

(22) Filed: Oct. 18, 2021

(65) Prior Publication Data

US 2022/0119976 A1    Apr. 21, 2022

Related U.S. Application Data

(60) Provisional application No. 63/093,363, filed on Oct. 19, 2020.

(51) Int. Cl.
| | |
|---|---|
| *H01F 7/06* | (2006.01) |
| *C25D 5/10* | (2006.01) |
| *C25D 7/06* | (2006.01) |
| *H01F 17/00* | (2006.01) |
| *H01F 41/061* | (2016.01) |

(52) U.S. Cl.
CPC ............ *C25D 7/0657* (2013.01); *C25D 5/10* (2013.01); *H01F 17/0013* (2013.01); *H01F 41/061* (2016.01)

(58) Field of Classification Search
CPC ...... C25D 5/10; C25D 7/0657; H01F 17/0013
See application file for complete search history.

(56) References Cited

U.S. PATENT DOCUMENTS

| | | | |
|---|---|---|---|
| 7,743,491 B2 * | 6/2010 | Lin | ...... H05K 3/3442 438/455 |
| 8,941,460 B2 | 1/2015 | Li et al. | |
| 9,018,050 B2 | 4/2015 | Li et al. | |
| 9,224,532 B2 | 12/2015 | Li et al. | |
| 9,330,829 B2 | 5/2016 | Li et al. | |
| 10,003,317 B2 | 6/2018 | Li et al. | |
| 10,276,942 B2 | 4/2019 | Li et al. | |
| 10,490,328 B2 | 11/2019 | Li et al. | |
| 11,031,456 B2 * | 6/2021 | Li | ...... H01L 28/10 |
| 11,444,148 B2 * | 9/2022 | Kim | ...... H01F 27/29 |
| 2014/0103486 A1 | 4/2014 | Li et al. | |
| 2014/0104030 A1 | 4/2014 | Li et al. | |

(Continued)

*Primary Examiner* — Paul D Kim
(74) *Attorney, Agent, or Firm* — Crowell & Moring LLP

(57) ABSTRACT

An electroplating method for enhancing the performance of rolled-up passive components comprises providing an array of rolled-up passive components on a substrate, where each rolled-up passive component comprises a multilayer strip in a rolled configuration including multiple turns spaced apart by gaps. The multilayer strip comprises a conductive pattern layer on a strain-relieved layer, and a core of each rolled-up passive component is defined by a first of the multiple turns. A layer comprising a functional material is electroplated onto the conductive pattern layer of each rolled-up passive component, thereby at least partly filling the gaps and/or the core with the functional material.

20 Claims, 22 Drawing Sheets

(56) References Cited

U.S. PATENT DOCUMENTS

| | | | |
|---|---|---|---|
| 2014/0234977 A1* | 8/2014 | Grimm | ............ B82Y 10/00 257/253 |
| 2014/0246764 A1 | 9/2014 | Li et al. | |
| 2015/0099116 A1 | 4/2015 | Li et al. | |
| 2015/0137930 A1 | 5/2015 | Li et al. | |
| 2016/0301377 A1 | 10/2016 | Li et al. | |
| 2017/0207522 A1 | 7/2017 | Li et al. | |
| 2018/0075956 A1 | 3/2018 | Li et al. | |
| 2019/0378890 A1 | 12/2019 | Li et al. | |

* cited by examiner

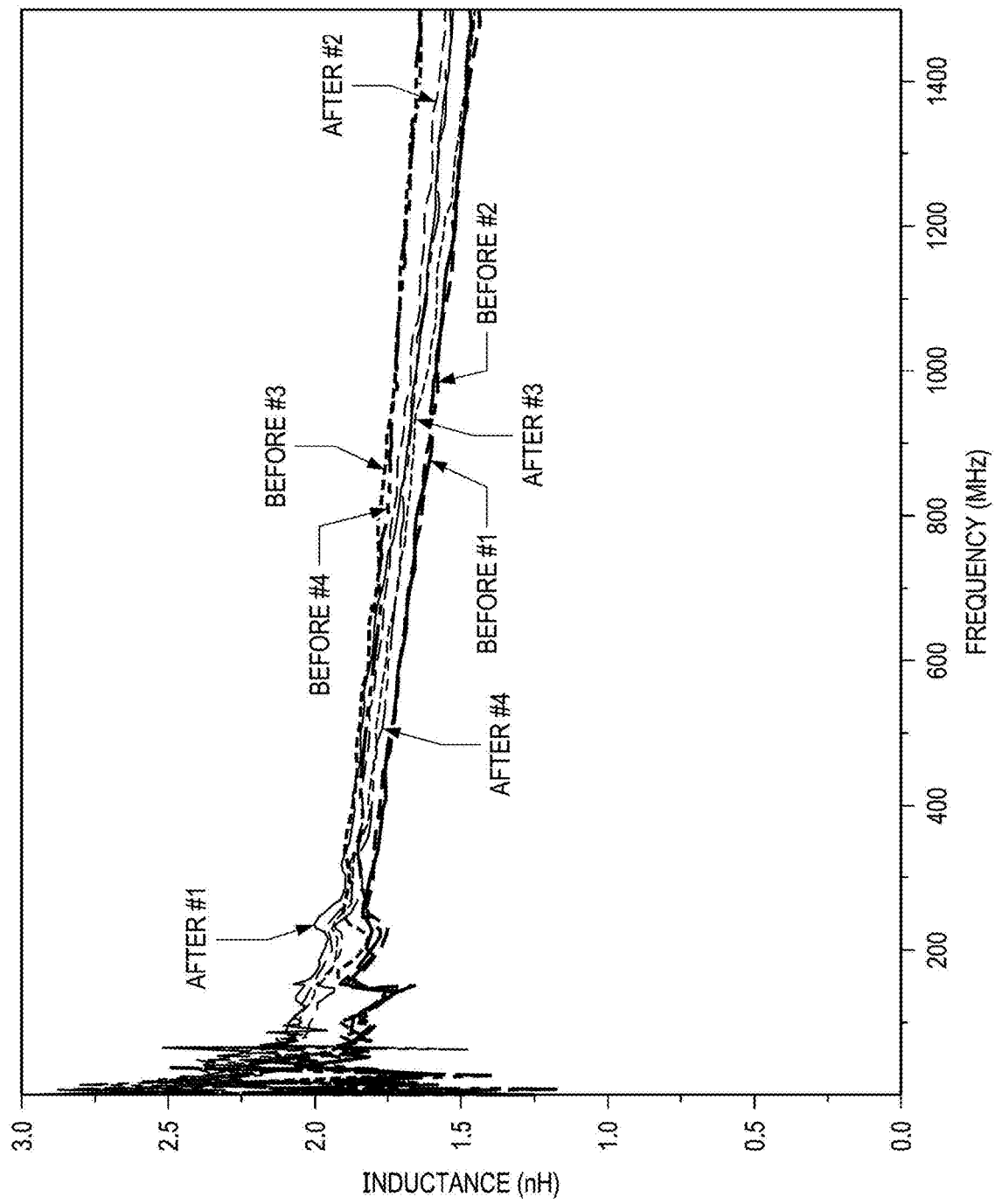

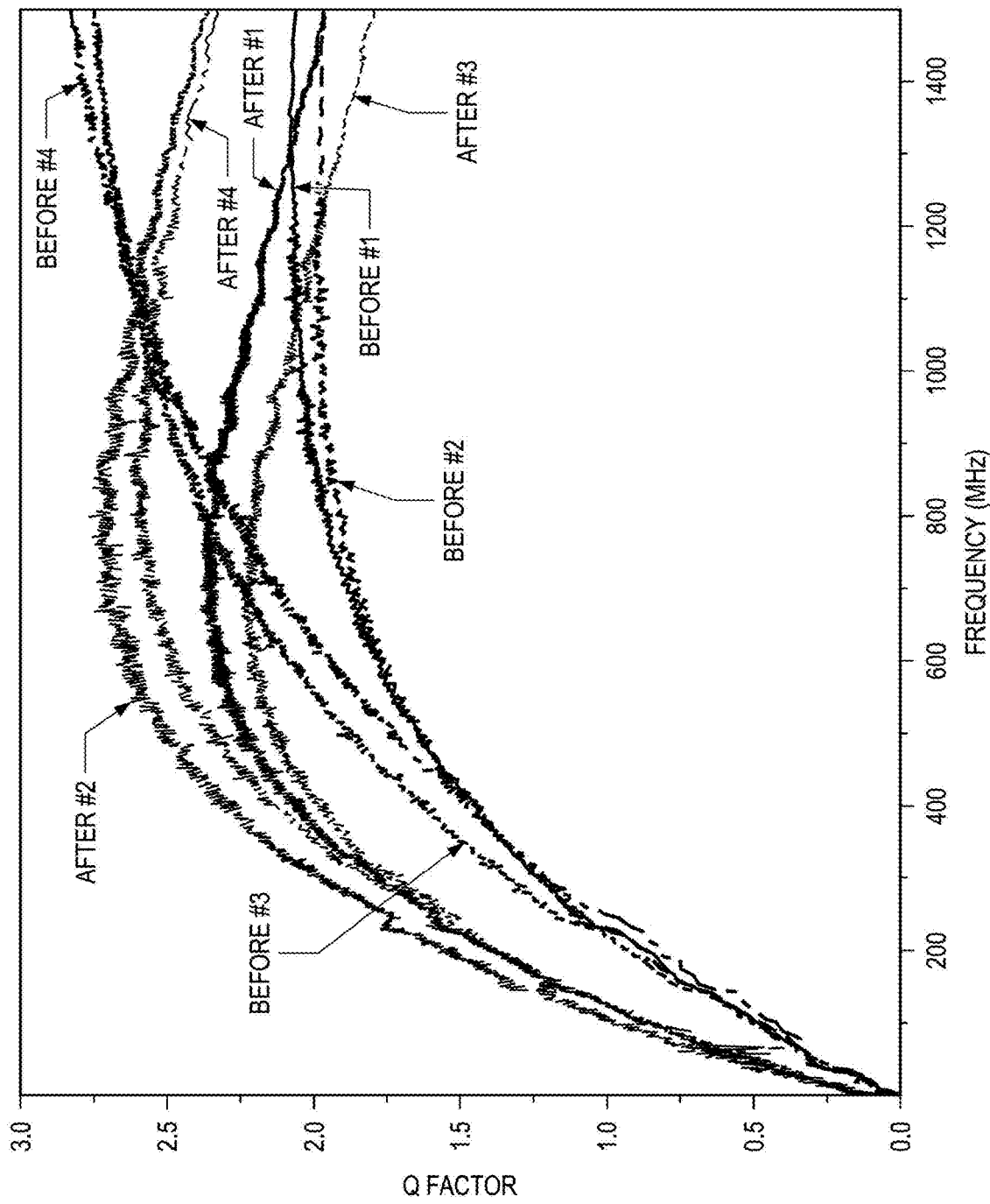

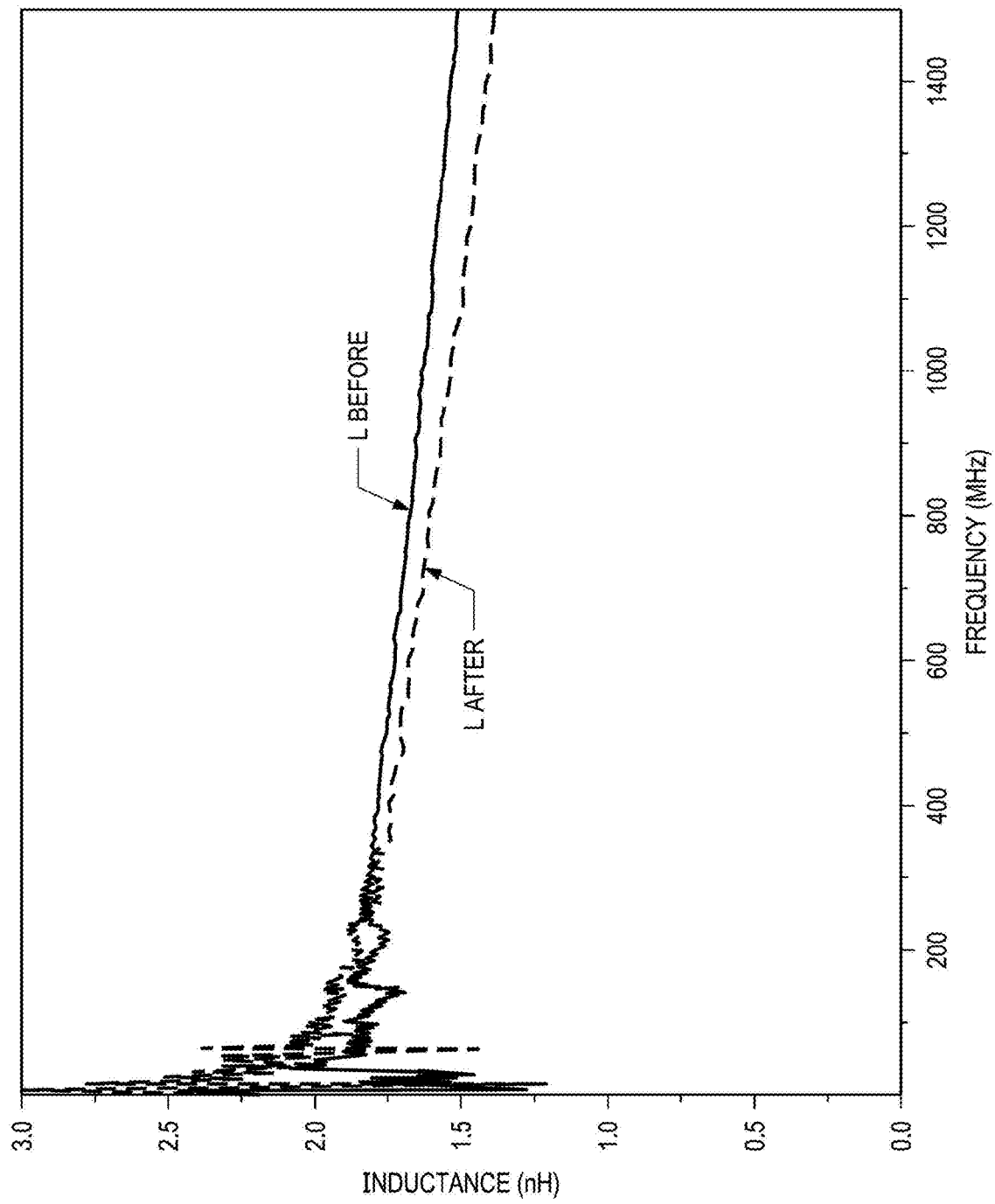

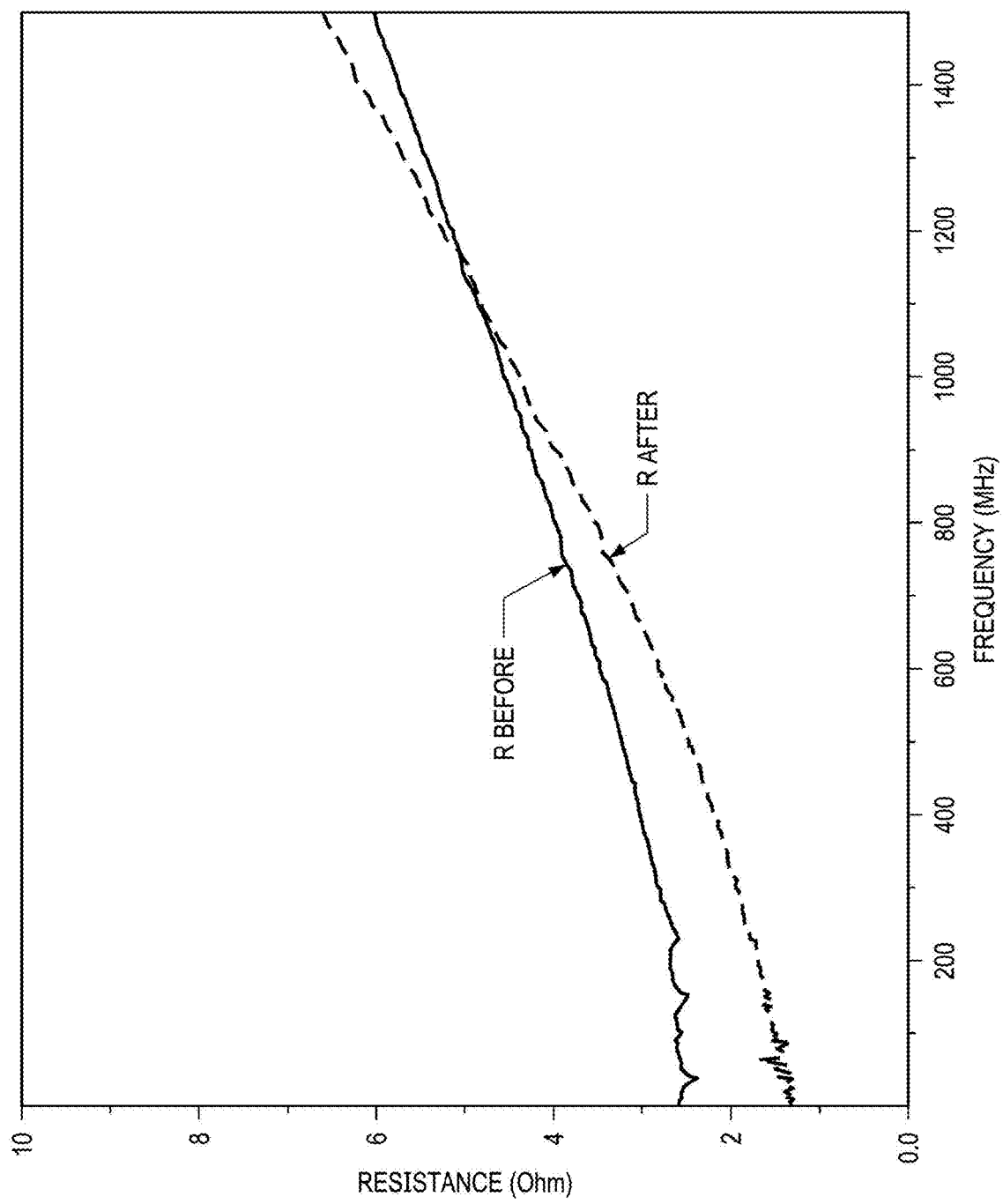

ELECTROPLATING METHOD FOR ENHANCING THE PERFORMANCE OF ROLLED-UP PASSIVE COMPONENTS

RELATED APPLICATION

The present patent document claims the benefit of priority under 35 U.S.C. 119(e) to U.S. Provisional Patent Application No. 63/093,363, filed on Oct. 19, 2020, and hereby incorporated by reference in its entirety.

FEDERALLY SPONSORED RESEARCH OR DEVELOPMENT

This invention was made with government support under award number EEC 1449548 and IIP 17-01047 from the National Science Foundation. The government has certain rights in the invention.

BACKGROUND

In modern day electronics, there is a relentless drive to reduce the size, power and cost of all devices and components, including passive electronic components such as inductors. On-chip inductors have widespread applications in radiofrequency integrated circuits (RFICs). Planar spiral inductors are the most commonly used on-chip inductors in current RFIC designs due to ease of fabrication with standard CMOS processes, which, at the same time, limit the design to a two-dimensional (2D) wafer surface. Conventional planar spiral inductors utilize self and mutual electromagnetic coupling of long parallel wires to achieve high inductance. For example, a 10 nH planar spiral inductor usually takes up to about 400×400 $\mu m^2$ on-wafer area with a typical maximum quality (Q) factor of about 6 at frequencies lower than 3 GHz and a self-resonance frequency of about 10 GHz. The large footprint introduces significant parasitic coupling capacitance and ohmic loss from the substrate, which are the two main reasons for the low Q factor and resonance frequency.

Work is on-going to shrink the size and maintain or improve the performance of inductors and other passive components. For example, novel rolled-up inductors with enhanced performance compared to that of their planar counterparts are described in U.S. Pat. No. 9,224,532, "Rolled-up Inductor Structure for a Radiofrequency Integrated Circuit (RFIC)," to Xiuling Li et al. Such devices may be fabricated using self-rolled-up membrane (S-RuM) technology, which exploits the spontaneous roll-up of multilayer strips or sheets that include strained layers. An exemplary multilayer strip may comprise a strained layer (e.g., a top sublayer in tension on a bottom sublayer in compression) in contact with a sacrificial interlayer on a substrate. Additional layers, such as a conductive pattern layer, which may comprise a metal layer, may be formed on the multilayer strip. The strained layer may be released from the substrate by etching away the sacrificial layer. Once released, the opposing strain within the layer generates a net momentum, driving the planar strip to roll up and form a rolled-up device. During roll-up, residual stress in the strained layer is fully or partially relieved. Accordingly, a rolled portion of the strained layer may be referred to as a strain-relieved layer.

Generally speaking, a thin conductive pattern layer may be beneficial to ensure a small footprint of the rolled-up device. On the other hand, thin metal layers may have a high DC resistance and hence a low Q factor due to surface and grain boundary resistance, and also a high RF resistance due to the skin effect of thin metal films. It would be beneficial to be able to increase the thickness of the conductive pattern layer without drastically increasing the diameter of the rolled-up device, so as to maintain the desired small device footprint.

BRIEF SUMMARY

An electroplating method for enhancing the performance of rolled-up passive components comprises providing an array of rolled-up passive components on a substrate, where each rolled-up passive component comprises a multilayer strip in a rolled configuration including multiple turns spaced apart by gaps. The multilayer strip comprises a conductive pattern layer on a strain-relieved layer, and a core of each rolled-up passive component is defined by a first of the multiple turns. A layer comprising a functional material is electroplated onto the conductive pattern layer of each rolled-up passive component, thereby at least partly filling the gaps and/or the core with the functional material.

BRIEF DESCRIPTION OF THE DRAWINGS

FIGS. 10A-10F show radiofrequency (RF) data, including plots of inductance, resistance and Q factor as a function of frequency, for four rolled-up passive components before and after electroplating.

DETAILED DESCRIPTION

A method of enhancing the inductance, inductance density, quality (Q) factor and/or bandwidth of rolled-up passive electronic components includes forming an array of rolled-up passive electronic components on a substrate and then exposing the array to one or more post-roll-up electroplating steps. The array may include tens or even hundreds of the rolled-up passive electronic components fabricated in close proximity to each other on the substrate. Employing the method described herein, all or a selected number of the rolled-up passive components on the substrate may undergo electroplating simultaneously. (For brevity, the term "rolled-up passive electronic components" may be replaced with "rolled-up passive components" or "rolled-up components" at various places throughout this disclosure.)

Figure 1A:
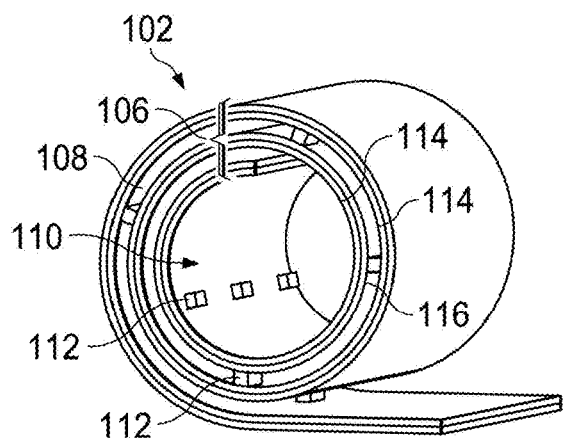
FIGS. 1A-1C show schematics of an exemplary rolled-up passive component before electroplating (FIG. 1A), after electroplating into the core and gaps (FIG. 1B), and after selective electroplating into the core (FIG. 1C).
Figure 2:
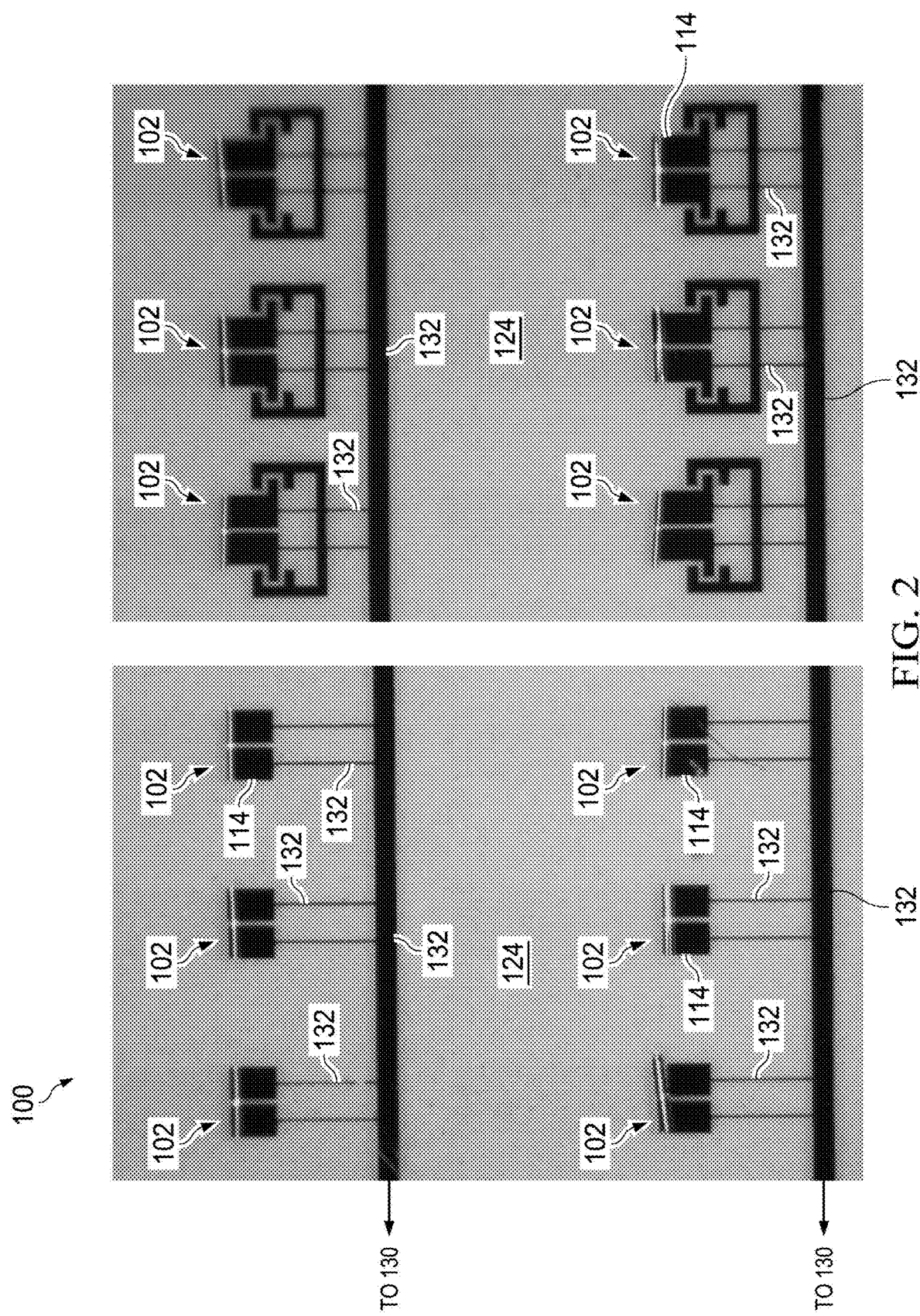
FIG. 2 shows optical images of part of an array of rolled-up passive components on a substrate, prior to electroplating.

Referring to FIG. 1A, each rolled-up passive component 102 comprises a multilayer strip 104 in a rolled configuration including multiple turns 106 spaced apart by gaps 108, where spacers 112 may be present in the gaps 108, as discussed further below. A core 110 of each rolled-up passive component 102 is defined by a first of the multiple turns 106. The multilayer strip 104 includes a conductive pattern layer 114 on a strain-relieved layer 116. Although just a few turns 106 are illustrated in FIG. 1A, the rolled-up passive component 102 may include dozens of turns 106 (e.g., from 2-50 turns). Part of an array 100 of the rolled-up passive components 102 on a substrate 124 prior to electroplating is shown in the optical images of FIG. 2. The array 100 may be an ordered array, as illustrated, or may comprise any arrangement of a number of the rolled-up passive components 102. Such rolled-up passive electronic components 102 may function as rolled-up inductors, transformers, or tubular resonant filters. The inventors have discovered that partly or completely filling the gaps 108 and/or the cores 110 of the rolled-up components 102 with a functional material by electroplating can drastically improve the performance of the components 102 without significantly increasing their on-chip footprint.

Figure 1B:
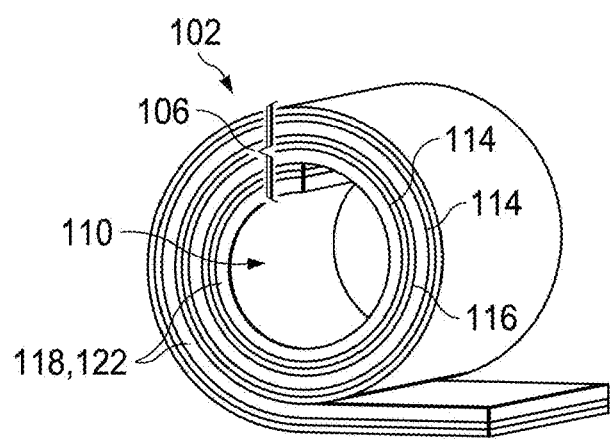

Accordingly, the array 100 may undergo an electroplating step to deposit a predetermined thickness or layer of a functional material 118 onto the conductive pattern layer 114 of each rolled-up passive component 102, as illustrated in FIG. 1B for an exemplary rolled-up component 102. The functional material 118 may be an electrically conductive material, a soft magnetic material, a piezoelectric material, a sensing material, an optomechanical material, or generally speaking any metal, alloy or other material capable of being electroplated. Consequently, the gaps 108 and/or the core 110 of each rolled-up component 102 may be at least partly filled with the functional material. In some cases, electroplating is carried out for a time sufficient to completely fill the gaps 108 and/or the core 110 of each rolled-up component 102 with the functional material. (If electroplating is employed to partly or completely fill only the gaps 108 or only the core 110 of each rolled-up component 102, the process may be described as selective electroplating, as explained below.) Also or alternatively, multiple electroplating steps may be employed to electrodeposit multiple layers and/or different functional materials. The layer(s) deposited by electroplating may comprise a single functional material, multiple functional materials, the same functional material as that of the conductive pattern layer, and/or a different functional material as that of the conductive pattern layer. Prior to electroplating, the gaps 108 may be from about 100 nm to about 5 microns in size (radial size or thickness), or more typically from about 1 micron to about 2 microns in size, and the cores 110 may have a diameter in a range from about 1 micron to about 200 microns, or more typically from about 10 microns to about 80 microns.

It is noted that electroplated material is deposited onto the conductive pattern layer, which is positioned on the strain-relieved layer but may not completely cover the strain-relieved layer. Accordingly, references in this disclosure to the cores or the gaps being "completely filled" with the functional material may be understood to refer to a complete filling in a radial or thickness direction over areas where the conductive pattern layer is present.

Referring again to FIG. 1B, the gaps 108 and optionally the cores 110 of some or all of the rolled-up passive electronic components 102 in the array 100 may be partly or completely filled with an electrically conductive material 122. Multiple layers of the electrically conductive material may be electrodeposited, with different electrically conductive materials being employed for different layers, if desired. As shown in the figures, electroplating may effectively increase the thickness of the conductive pattern layer 114 post-roll-up. For example, a conductive pattern layer 114 having a thickness that can be successfully rolled up (e.g., in a range from about 10-400 nm, and typically in the range from about 100-300 nm) may undergo a post-roll-up electroplating process to increase the thickness to the microscale (e.g., in a range from about 0.5-10 microns, and typically from 1-3 microns). In other words, after roll-up, an electrically conductive material (the same as or different from that employed for the conductive pattern layer) may be deposited into the core 110 and/or the gaps 108 between the turns by electroplating, such that the electrically conductive material increases the thickness of the conductive pattern layer 114. This considerable thickness increase may allow for a reduced DC resistance and other performance improvements to be achieved without impairing the roll-up process or significantly increasing the diameter of the rolled-up passive electronic component 102.

Figure 1C:
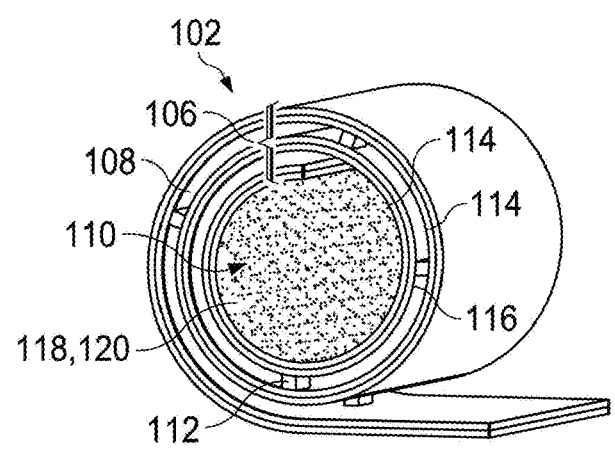

In another example, as shown in FIG. 1C, the cores 110 of some or all of the rolled-up passive electronic components 102 in the array 100 may be partly or completely filled with a soft magnetic material 120. More specifically, in this example, only the cores 110 (and not the gaps 108), may be partly or completely filled with the soft magnetic material 120. Integrating a soft magnetic material 120 into the core 110 of the rolled-up component 102 may result in a significant enhancement in magnetic flux density and/or provide other performance benefits. In some cases, the cores 110 may be partly or completely filled with multiple layers of the soft magnetic material 120, where different layers may comprise different soft magnetic materials.

Figure 3:
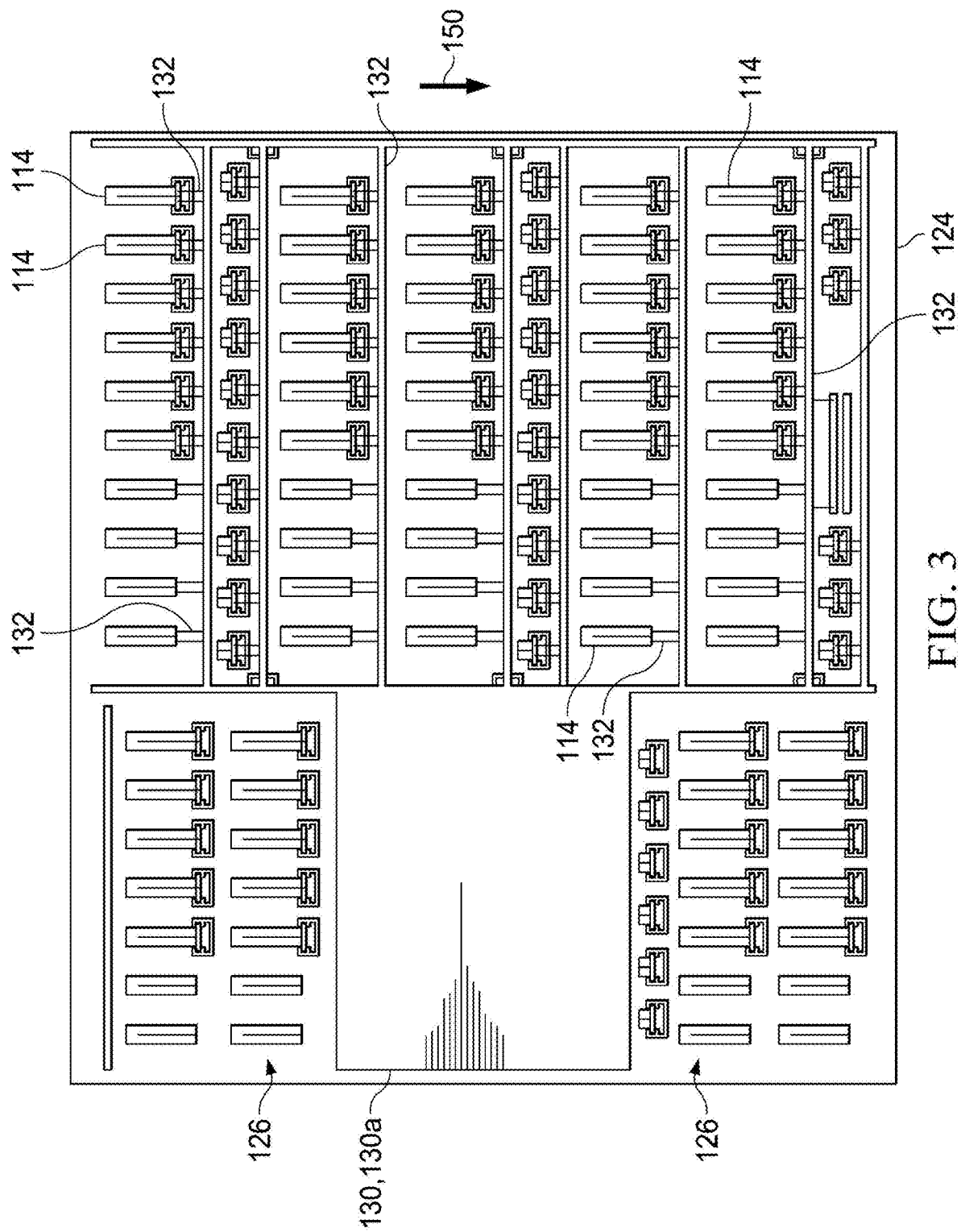
FIG. 3 shows, via an exemplary lithographic mask design, the connectivity between the conductive pattern layers of an array of rolled-up passive components and a global contact on the substrate.

Simultaneous electroplating of all of the rolled-up components 102 in the array 100 is facilitated by connection to a global contact on the substrate 124. FIG. 3 shows an exemplary lithographic mask design for thin film deposition and patterning that reveals how the conductive pattern layers 114 of the components 102 are electrically connected to the global contact 130 during fabrication (prior to roll-up). Because FIG. 3 shows a mask design, the schematic shows a pre-roll-up top-down view of the conductive pattern layer 114 of each rolled-up component. It is noted that a top end of each conductive pattern layer 114 corresponds to a release end of the multilayer strip, and a downward direction 150 corresponds to the rolling direction to form the rolled-up component 102. Since the electrical connections made during fabrication are sustained after roll-up, the rolled-up components 102 are referred to in the following description, even though they are not shown in the pre-roll-up schematic, as is the case for all of the mask designs in this disclosure. As would be recognized by one of skill in the art, the conductive pattern layer 114 of each rolled-up passive component 102 may have any suitable pattern or geometry, and is not limited to the exemplary patterns shown in this disclosure.

Referring to FIG. 3, the conductive pattern layer 114 of each of the rolled-up passive components 102 is electrically connected to a global contact 130 on the substrate 124, which may be sapphire wafer. That is, the rolled-up passive components 102 intended to undergo electroplating are electrically connected to the global contact 130; the substrate 124 may further include control samples 126 that are not intended to undergo electroplating and which are not electrically connected to the global contact. The global contact 130 may be a first global contact 130a, as explained below. The connectivity between the conductive pattern layer 114 of each rolled-up passive electronic component 102 and the global contact 130 can be achieved by contact lines 132 formed on the substrate 124 during fabrication (see also the optical images of FIG. 2), in particular, during the thin film deposition and patterning steps employed to form the conductive pattern layer 114. The mask design determines not only the size and shape of each conductive pattern layer 114, but also the path of the contact lines 132 that electrically connect the conductive pattern layers 114 to the global contact 130, which is also defined by the mask. Consequently, the conductive pattern layers 114, the global contact(s) 130 and the contact lines 132 formed during thin film deposition and patterning may comprise the same electrically conductive material.

Figure 4:
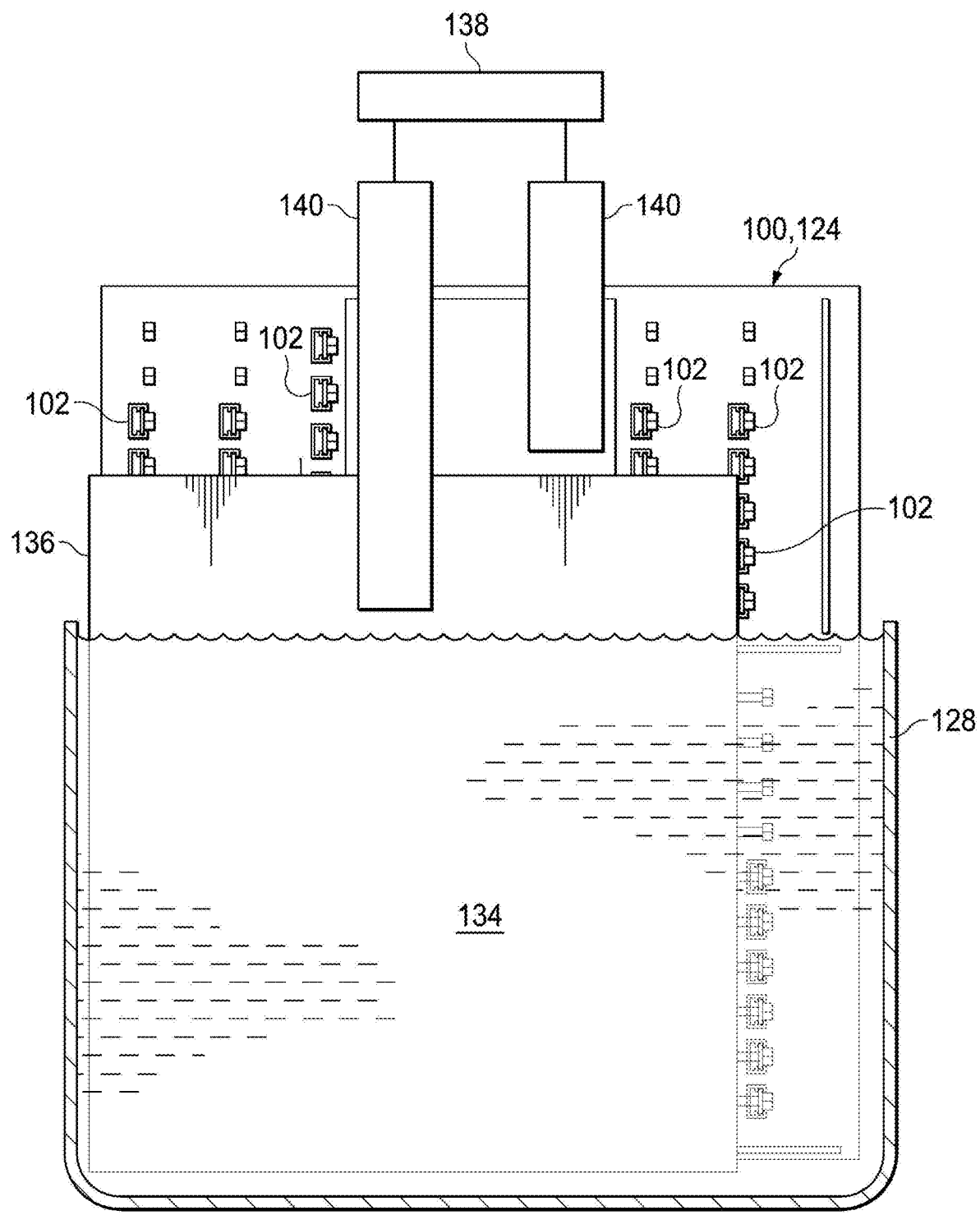
FIG. 4 is a schematic of the electroplating process.

Referring now to FIG. 4, electroplating may comprise immersing the substrate 124 comprising the array 100 of rolled-up passive electronic components 102 into an electroplating bath 128 comprising an electroplating solution 134 and an electrode (e.g., anode) 136. The substrate 124 and the electrode 136 are spaced apart from each other in the electroplating bath 128. The distance between the anode 136 and the substrate 124 may be minimized to ease metal ion access during electroplating. Also or alternatively, the areal dimensions of the anode 136 may be controlled. Preferably, the anode 136 is sized to match or overlap the entire substrate 124 to maintain parallel diffusion lengths in the electroplating solution 134. To commence electroplating, the electrode 136 and the global contact 130 are electrically connected to a power source 138, e.g., by alligator clips or another type of electrical connector 140, thereby completing the electroplating circuit.

A suitable electroplating solution 134 may be selected depending on the functional material to be deposited and may be obtained commercially or prepared using electroplating recipes known in the art. For example, a copper(II) sulfate solution may be employed to electroplate copper. While the array 100 of rolled-up components 102 is exposed to appropriate electrolytic conditions (e.g., solution composition, pH, temperature, and current density) in the electroplating bath 128, a layer comprising the selected functional material 118 builds up on the conductive pattern layer of each rolled-up component 102. The thickness of the layer may be controlled by the time duration of the electroplating. Electroplating may be carried out using a pulsed current, constant current, or constant voltage mode. Conventional DC plating may accumulate excess negative charge on the cathode (the substrate 124) and thus limit the supply of metal ions. Periodically switching-off (or reversing) the current supply may help in breaking the ionic layer and allow easier passage of metal (e.g., Cu) ions to the target areas. Moreover, during off time, ions can migrate to areas of low current density and thus help improve the uniformity of the electroplated layer. Current density (current and plating area), pulse on/off time and the number of cycles may be optimized over a set of samples to plate a high quality, thick layer comprising the functional material inside the rolled-up components. Prior to or during electroplating, the electroplating solution may be stirred, mixed and/or otherwise agitated to ensure full penetration of the electroplating solution into the cores and the gaps of the rolled-up passive electronic components. Examples of electroplating procedures are described below. After electroplating, the substrate 124 may be removed from the electroplating bath 128 and dried (e.g., on a hot plate), and the rolled-up passive electronic components 102 may undergo testing or use. To disconnect the rolled-up components 102 from the global contact 130, the substrate/wafer 124 may be diced or cleaved; also or alternatively, the contact lines 132 may be removed by etching or scratching.

Figure 12A:
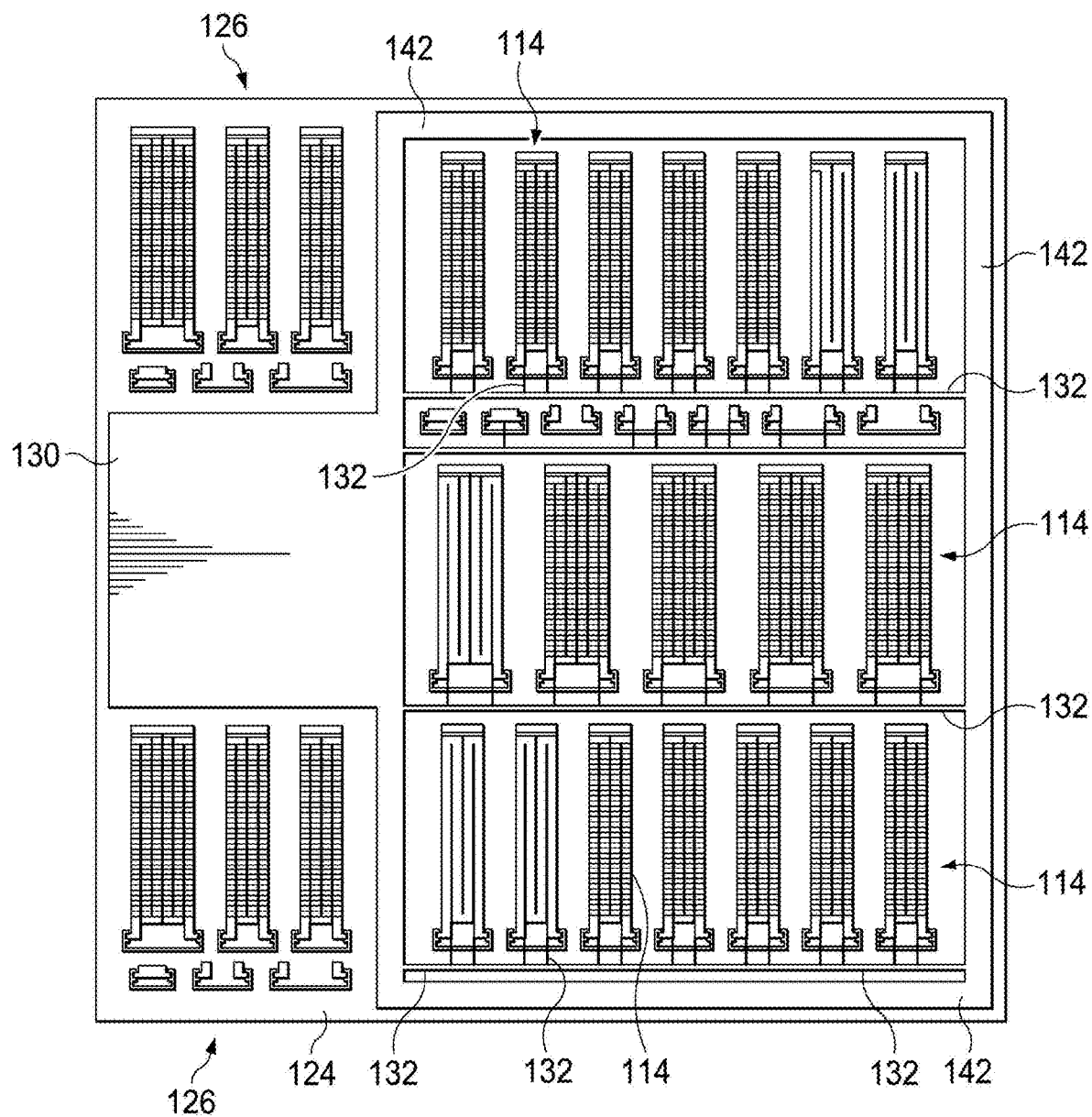
FIG. 12A shows another exemplary lithographic mask design that integrates core and gap plating of the rolled-up passive components.

If an entirety of the conductive pattern layer 114 of a given rolled-up passive electronic component 102 is electrically connected to the global contact, then the functional material 118 may be electroplated onto the entire conductive pattern layer 114, and consequently into both the gaps 108 and the core 110 of the rolled-up passive electronic component 102. This configuration is illustrated by the rolled-up component of FIG. 1B in conjunction with the mask design of FIG. 3, where the entire conductive pattern layer 114 of each of the rolled-up passive electronic components 102 (except for the control samples 126) is electrically connected to the global contact 130. FIG. 12A shows another example of a mask design that includes one global contact for simultaneous plating of the core and gaps and which may have further improvements as described below.

If only a portion of the conductive pattern layer 114 of a given rolled-up passive electronic component 102 is electrically connected to the global contact 130, and a remaining portion of the conductive pattern layer 114 is electrically isolated from the global contact 130, then the functional material 118 may be selectively electroplated onto (only) the portion of the conductive pattern layer 114 that is connected to the global contact 130. This configuration is illustrated by the mask designs of FIGS. 5 and 11A in conjunction with the rolled-up component of FIG. 1C, which includes a functional material electroplated in the core (only).

Figure 5:
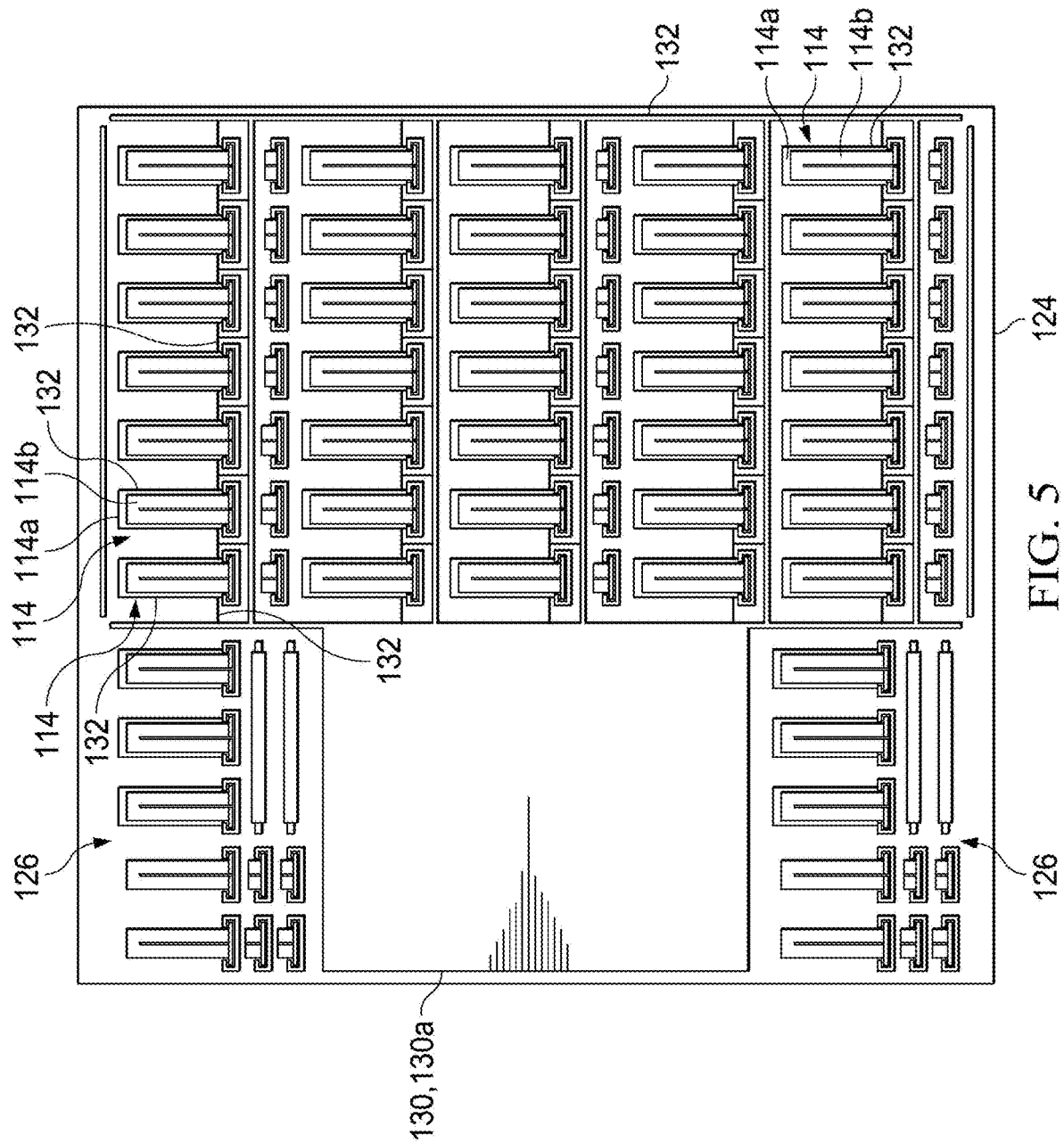
FIG. 5 shows, via another exemplary lithographic mask design, the connectivity between a portion of each of the conductive pattern layers and a global contact on the substrate so as to facilitate selective electroplating of the rolled-up passive components.

In this example, only the portion 114a of the conductive pattern layer 114 at the release end of the multilayer strip—which rolls up to define the core 108—is electrically connected by contact lines 132 to the global contact 130. This portion 114a of the conductive pattern layer 114 may be referred to as the "first portion" 114a. In this example, a remaining portion 114b of the conductive pattern layer 114, which is positioned away from the release end, may be electrically isolated from the global contact 130 and may be referred to as the "second portion" 114b of the conductive pattern layer 114. Such a configuration may be applied to some or all of the rolled-up passive electronic components 102 in the array 100. After roll-up of the components 102 configured as shown in FIG. 5, the first portion 114a of the conductive pattern layer 114 surrounds the core 110 so as to promote electroplating selectively within the core 110 when the global contact 130 is electrically connected to the power source 138, as illustrated in FIG. 4.

Alternatively, though not illustrated in the figure, the contact lines 132 to the global contact 130 may extend from the second portion 114b of the conductive pattern layer 114, instead of the first portion 114a. Since, after roll-up, the second portion 114b may be positioned outside the core 110 surrounding the gaps 108, electroplating may occur selectively within the gaps 108 when the global contact 130 is electrically connected to the power source. As would be apparent from the preceding description, the rolled-up passive electronic components 102 may be configured as desired prior to roll-up for selective electroplating. For example, electroplating may occur selectively within one gap or certain gaps, but not others.

Figure 6:
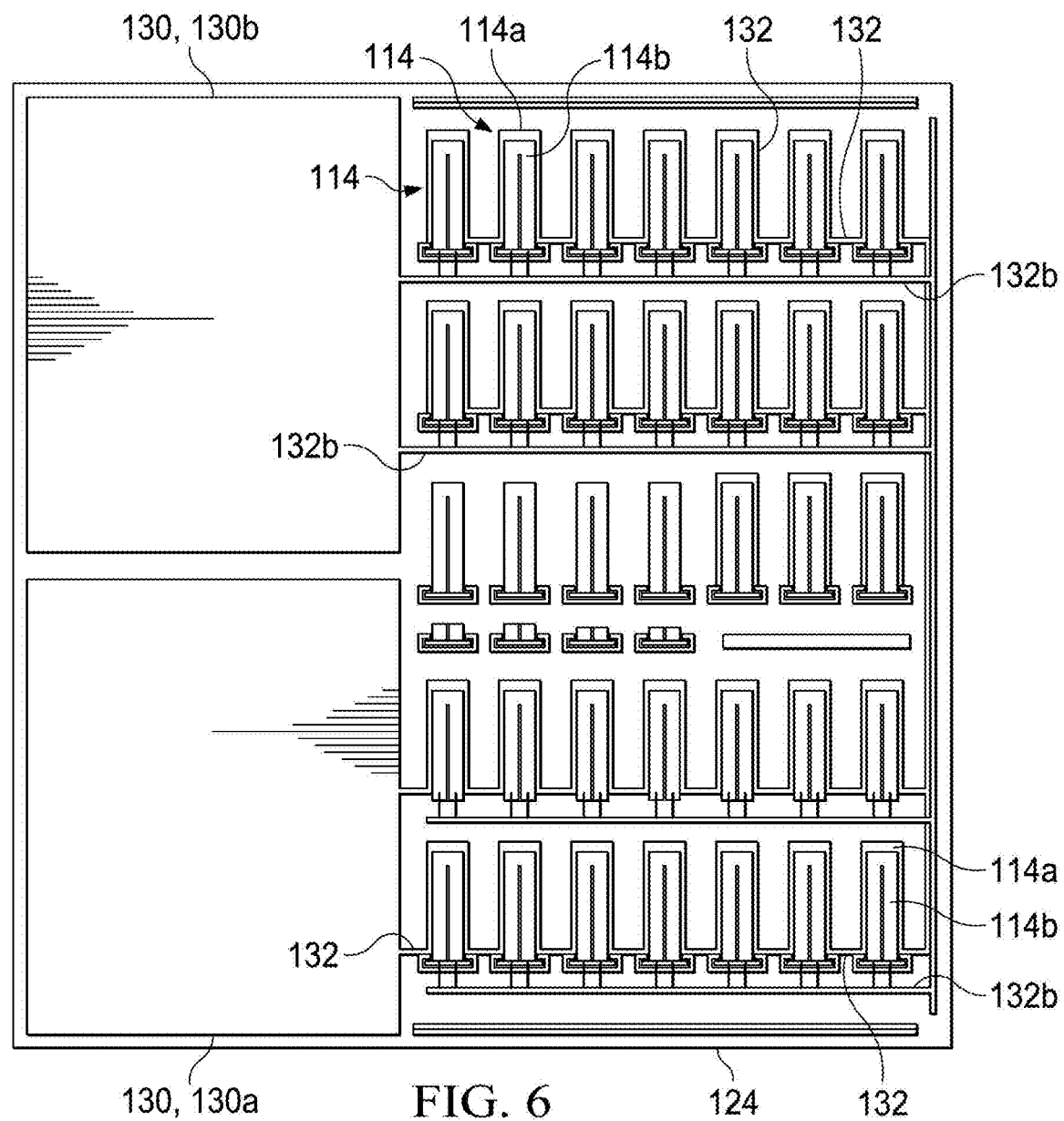
FIG. 6 shows, via a further exemplary lithographic mask design, the connectivity between a first portion of each of the conductive pattern layers and a first global contact on the substrate, and the connectivity between a second portion of each of the conductive pattern layers and a second global contact on the substrate, so as to facilitate selective electroplating of the rolled-up passive components in two separate electroplating steps.

Referring now to the mask design of FIG. 6, instead of simply being electrically isolated from the first portion 114a of the conductive pattern layer 114, the second portion 114b of the conductive pattern layer 114 may further be electrically connected to a second global contact 130b on the substrate 124 via additional contact lines 132b. An insulating layer (e.g., an alumina layer deposited by atomic layer deposition (ALD) or another method) may be employed for electrical isolation of the contact lines 132,132b. Such a configuration may enable selective electroplating onto the second portion 114b of the conductive pattern layer 114 in a separate electroplating step that may occur before or after electroplating onto the first portion 114a of the conductive pattern layer 114. Accordingly, different parts of the rolled-up passive component 102 may be electroplated with different materials. For example, an electrically conductive material 122 such as copper or gold may be electroplated in the gaps 108 to increase the thickness of the conductive pattern layer 114, and, in a separate electroplating step, a soft magnetic material 120 such as permalloy may be electroplated into the core 110 to enhance the electromagnetic properties of the rolled-up passive electronic component 102. The second electroplating step may comprise immersing the substrate 124 comprising the array of rolled-up passive electronic components 102 into a second electroplating bath comprising a second electroplating solution and an electrode, where electroplating is carried out as described above, except the electrode and the second global contact 130b are electrically connected to a power source to complete the electroplating circuit and commence electroplating onto the second portion 114b of the conductive pattern layer 114.

Forming the array of rolled-up passive electronic components may comprise rolling up patterned thin film mesas arranged in an array on the substrate, where each patterned thin film mesa comprises a patterned strained layer that becomes the strain-relieved layer upon roll-up, the conductive pattern layer on the patterned strained layer, and spacers on the conductive pattern layer, where a patterned sacrificial layer lies between the substrate and the patterned strained layer.

The patterned thin film mesas may be fabricated using deposition and patterning methods known in the art. A sacrificial layer (e.g., a germanium layer) may be deposited on the substrate by a method such as electron-beam evaporation. A strained layer comprising silicon nitride or aluminum nitride, for example, may be formed on the sacrificial layer by plasma enhanced chemical vapor deposition (PECVD) under conditions suitable to produce an upper portion under tensile stress and a lower portion under compressive stress; typically low frequency PECVD is used to form the lower portion and high frequency PECVD is used to form the upper portion. The strained layer may be held on the substrate by the sacrificial layer, which typically has a relatively large Young's modulus to avoid absorbing strain energy from the strained layer. The sacrificial and strained layers are patterned to form an array of mesas, where each mesa includes a patterned strained layer on a patterned sacrificial layer. Next, on each mesa in the array, a conductive pattern layer may be formed on the patterned strained layer by metal film deposition and lithographic patterning. The conductive pattern layer may comprise at least one conductive strip having a length extending in a rolling direction where the length is typically at least about 1 mm, at least about 3 mm, or at least about 6 mm, and/or as large as about 10 mm. The conductive pattern layer has a sufficient thickness to be a continuous conductive pattern layer; typically, the thickness of the conductive pattern layer (prior to electroplating) is in a range from about 10 nm to about 200 nm. After the conductive pattern layer is formed, a cover layer (e.g., an alumina layer) may be deposited over the entire mesa. The cover layer may help prevent oxidation of the conductive pattern layer, which in some examples may comprise copper, and/or may help improve the rolling process (e.g., reduce the likelihood of tearing).

Rolling up the patterned thin film mesas may entail, for each patterned thin film mesa, initiating removal of the patterned sacrificial layer from the substrate to release an end of the patterned strained layer, and continuing the removal of the patterned sacrificial layer to allow the patterned strained layer to move away from the substrate and roll up to relieve strain, where liquid-phase or vapor-phase etching may be employed to remove the patterned sacrificial layer. Thus, the array of rolled-up passive electronic components, which may include rolled-up inductors, rolled-up transformers, and/or rolled-up tubular resonant filters, may be formed.

The electrically conductive material used for electroplating and/or to form the conductive pattern layer may comprise carbon, silver, gold, aluminum, cobalt, copper, molybdenum, nickel, palladium, platinum, ruthenium, titanium, titanium nitride, tungsten, and/or zinc. The soft magnetic material may comprise iron, nickel, chromium, iron oxide, a ferrite, iron nitride, manganese selenide, a nickel-iron alloy (e.g., permalloy), and/or an iron-silicon-aluminum alloy. The ferrite may be selected from $ZnFe_2O_4$, $MnFe_2O_4$, $NiFe_2O_4$, $CoFe_2O_4$, $Co_xNi_{1-x}Fe_2O_4$, $Co_xZn_{1-x}Fe_2O_4$, $Ni_xZn_{1-x}Fe_2O_4$, and/or $Mn_xZn_{1-x}Fe_2O_4$, where $0<x<1$. The strain-relieved layer may comprise aluminum nitride, silicon nitride (e.g., $SiN_x$, where $0.5 \leq x \leq 1.5$), silicon oxide, or boron nitride.

Figure 7:
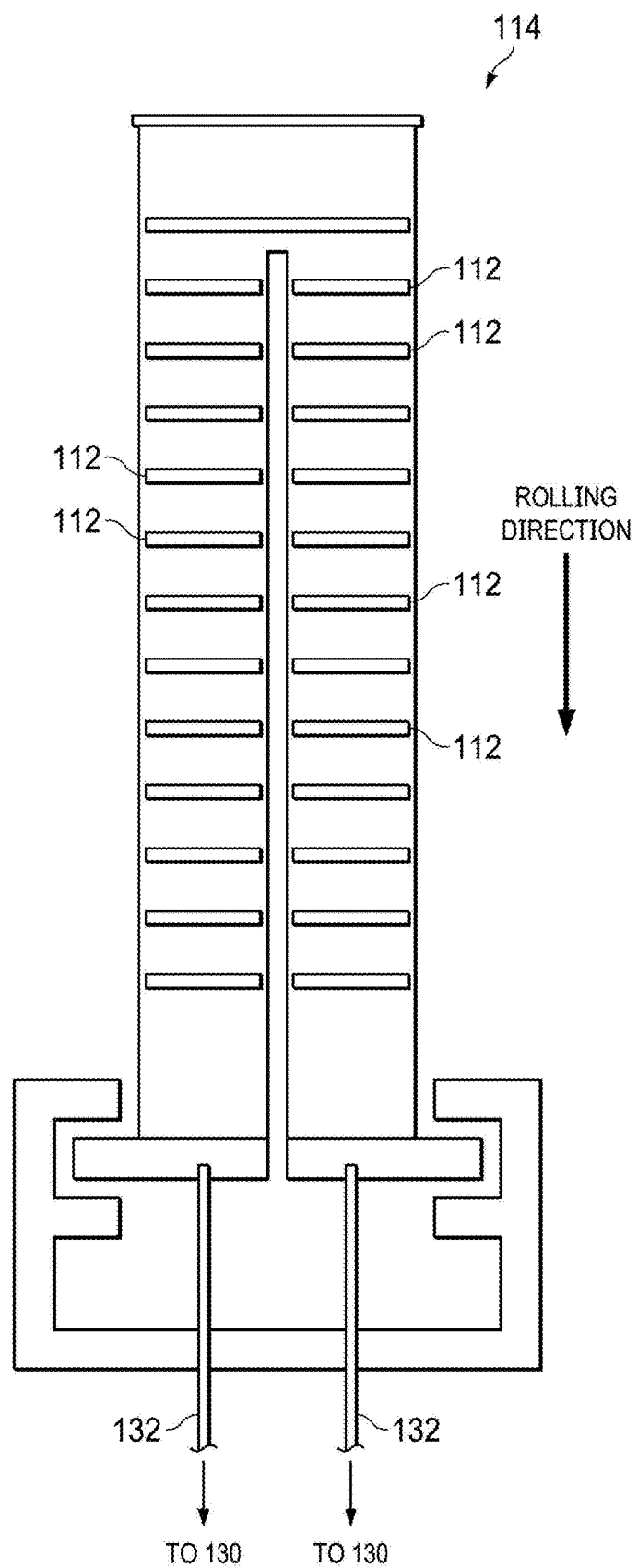
FIG. 7 is a close-up view of the one of the conductive pattern layers shown in FIG. 3, where spacers can be seen.
Figure 8A:
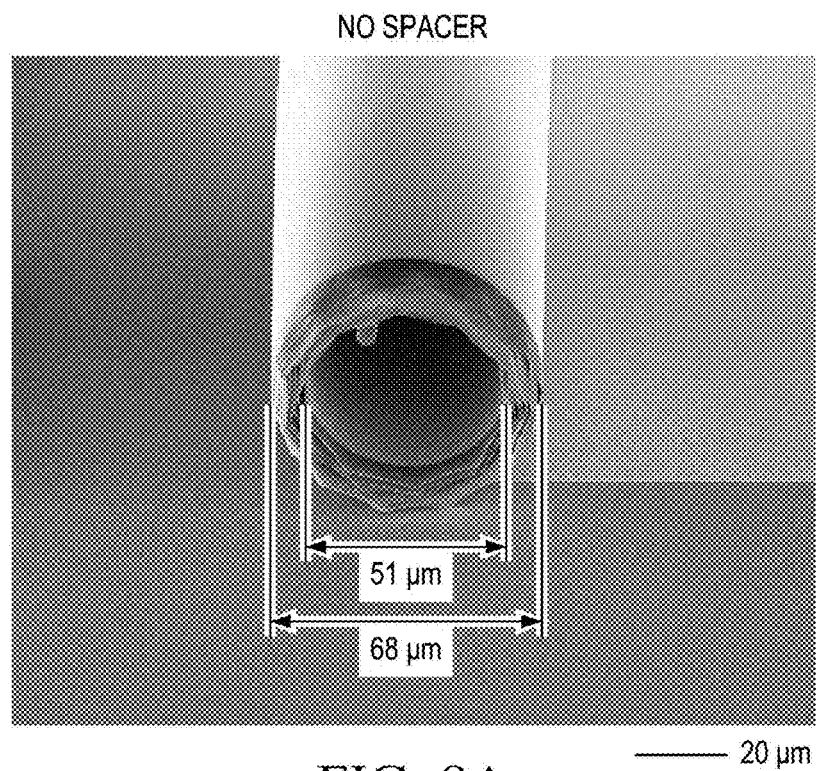
FIGS. 8A-8F show scanning electron microscope (SEM) images of rolled-up passive components fabricated with different sizes and arrangements of line spacers prior to electroplating.
Figure 8B:
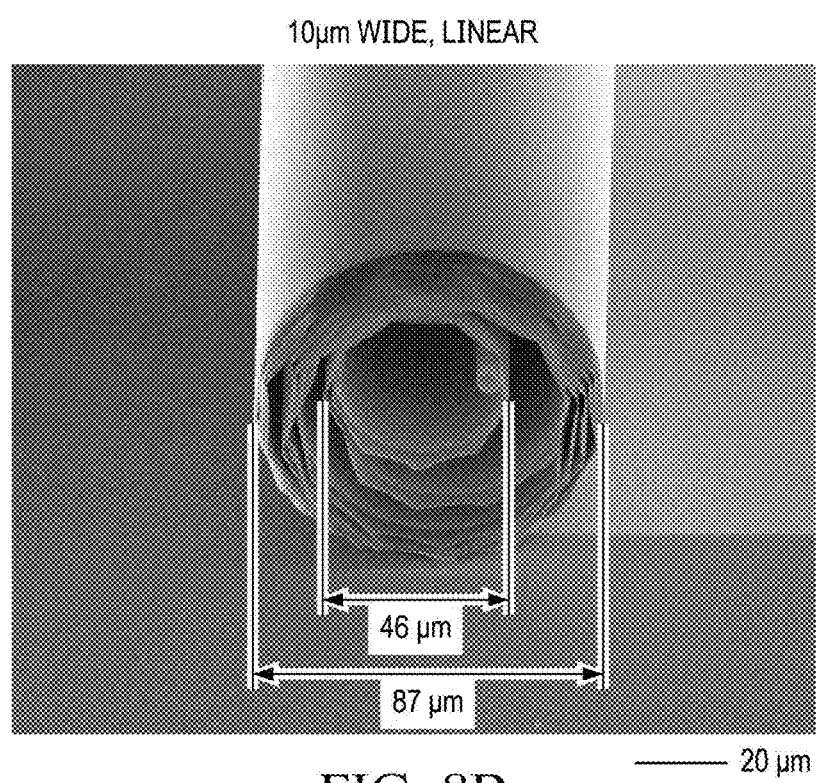
Figure 8C:
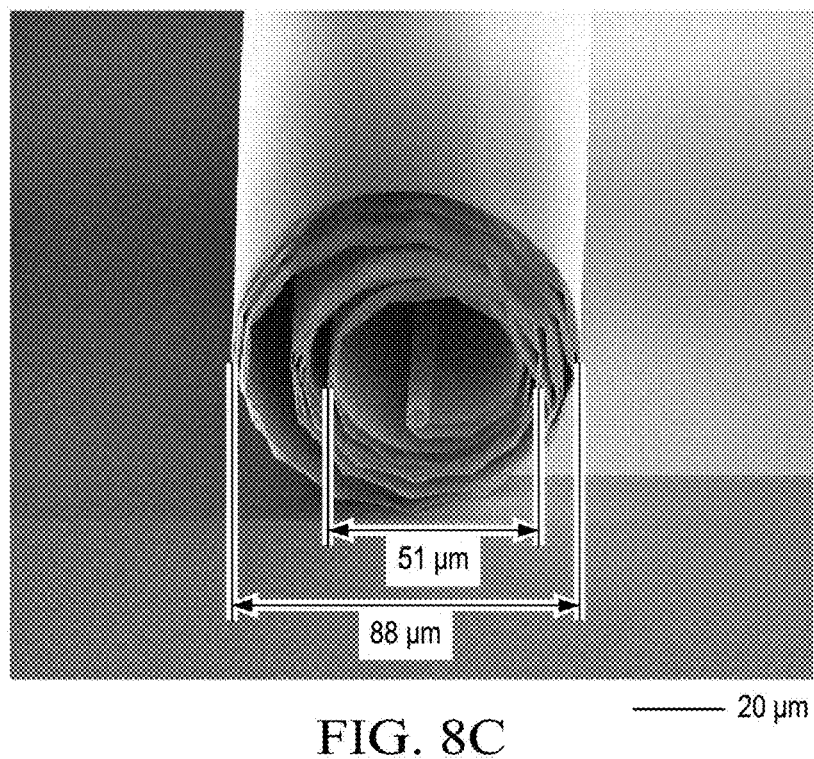
Figure 8D:
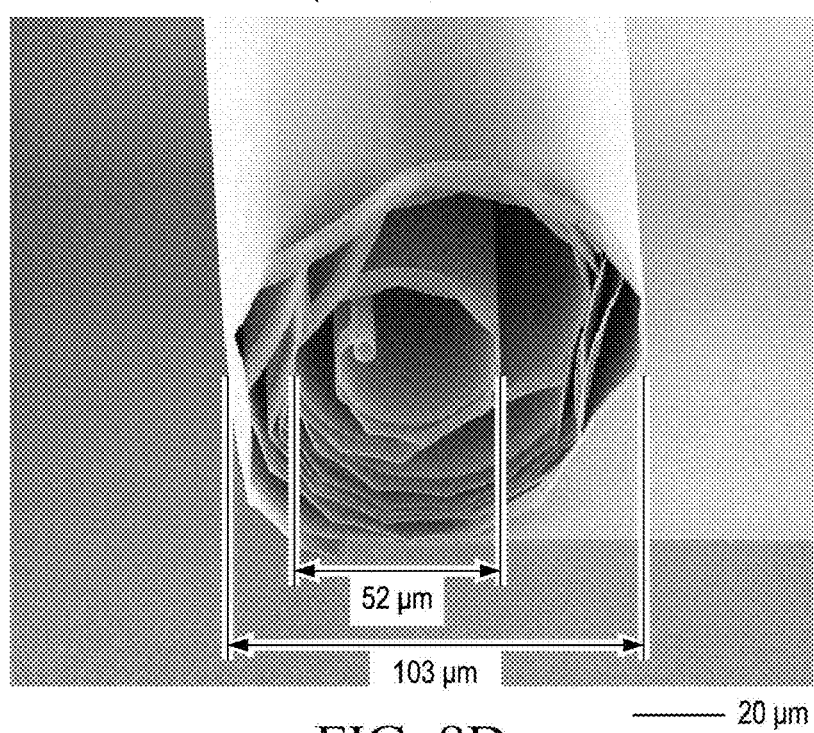
Figure 8E:
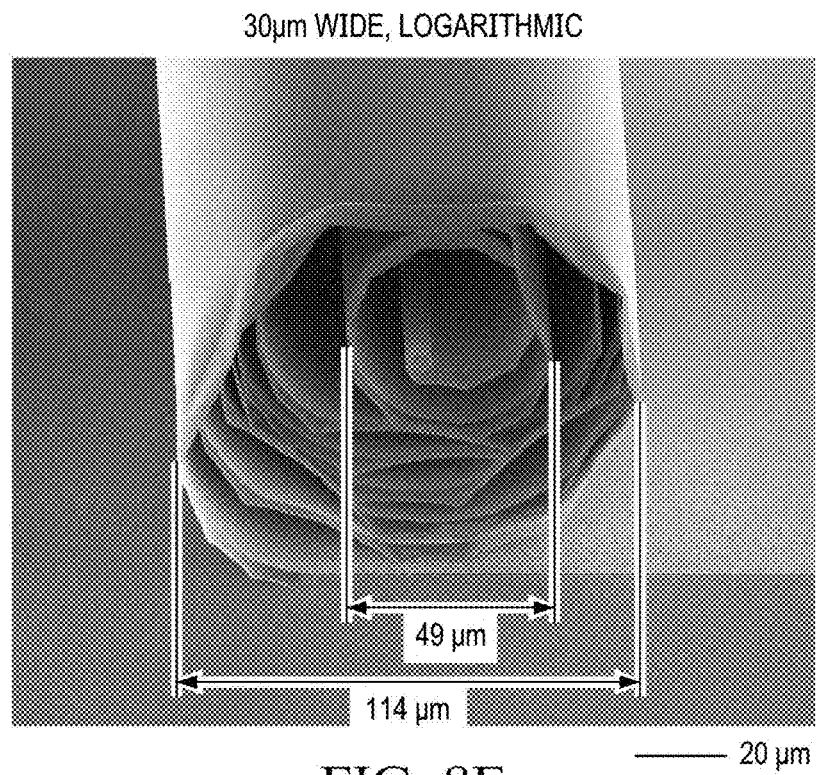
Figure 8F:
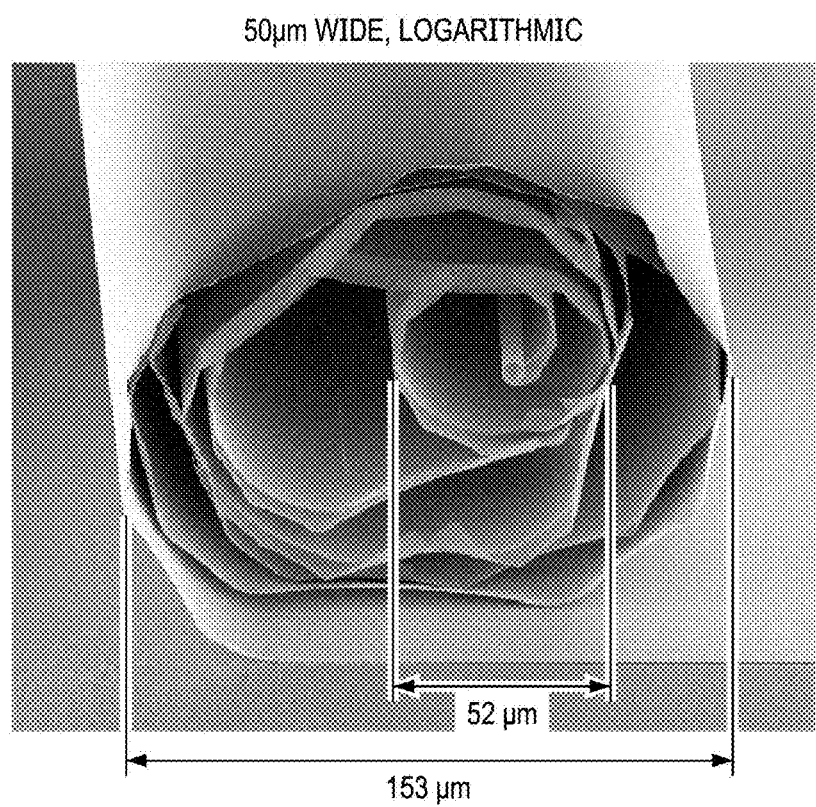
Figure 9A:
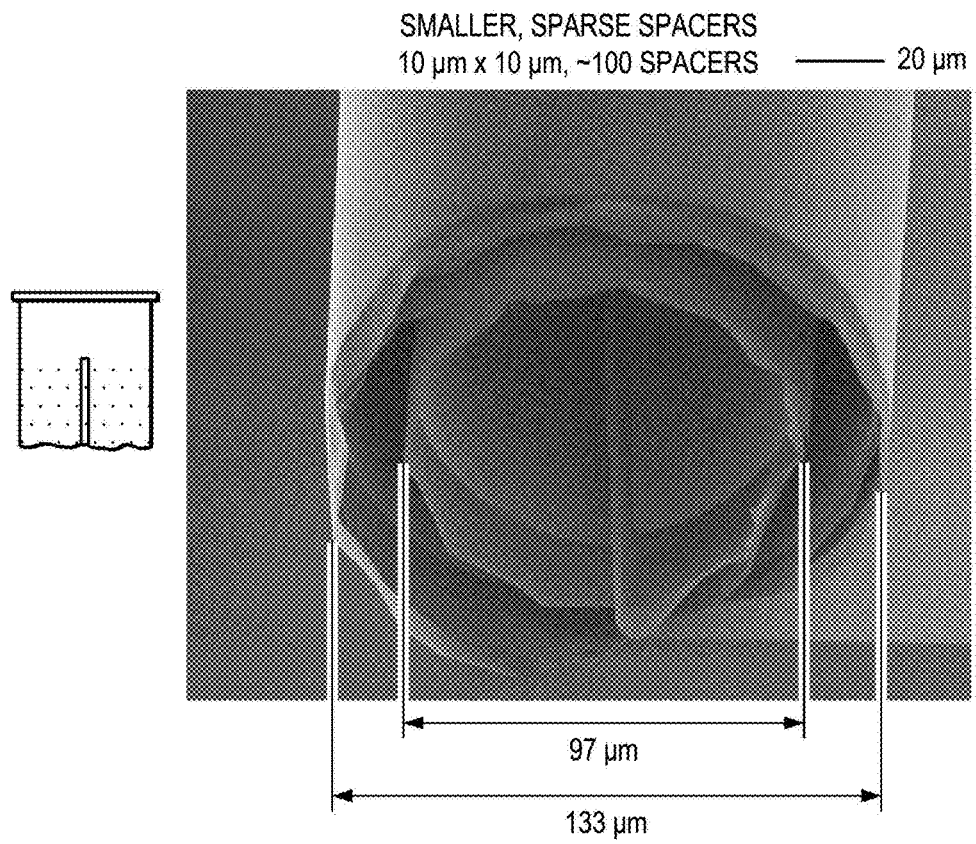
FIGS. 9A-9C show SEM images of rolled-up passive components fabricated with different sizes and arrangements of cuboidal spacers prior to electroplating.
Figure 9B:
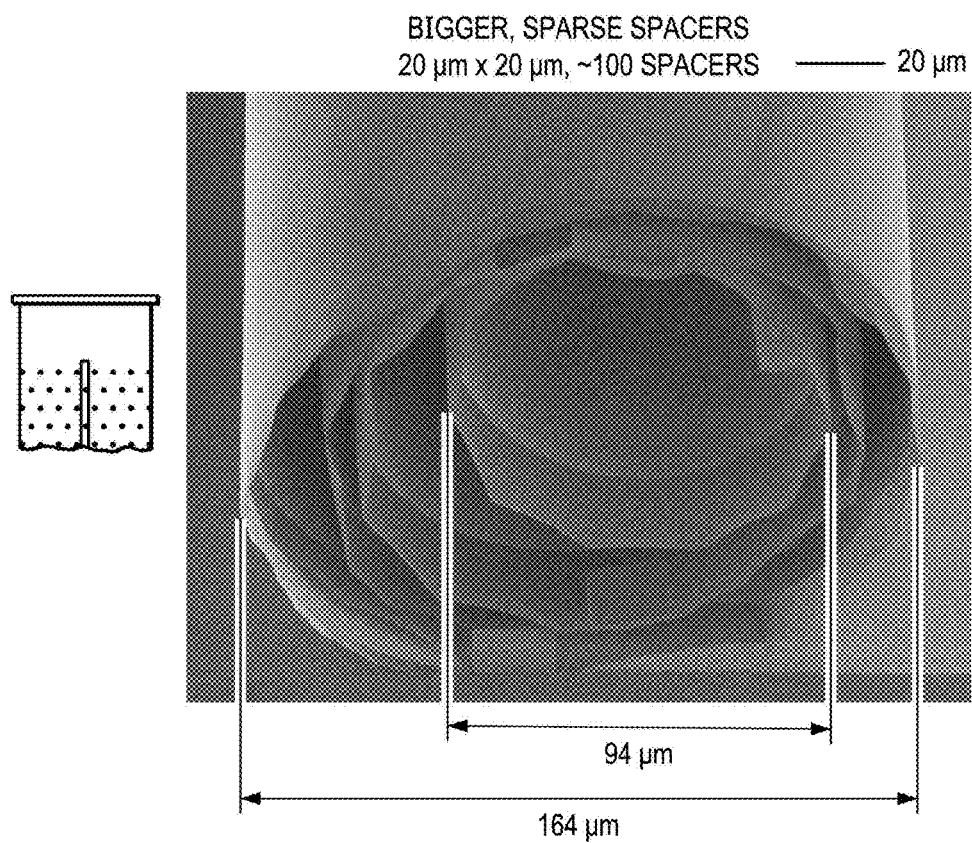
Figure 9C:
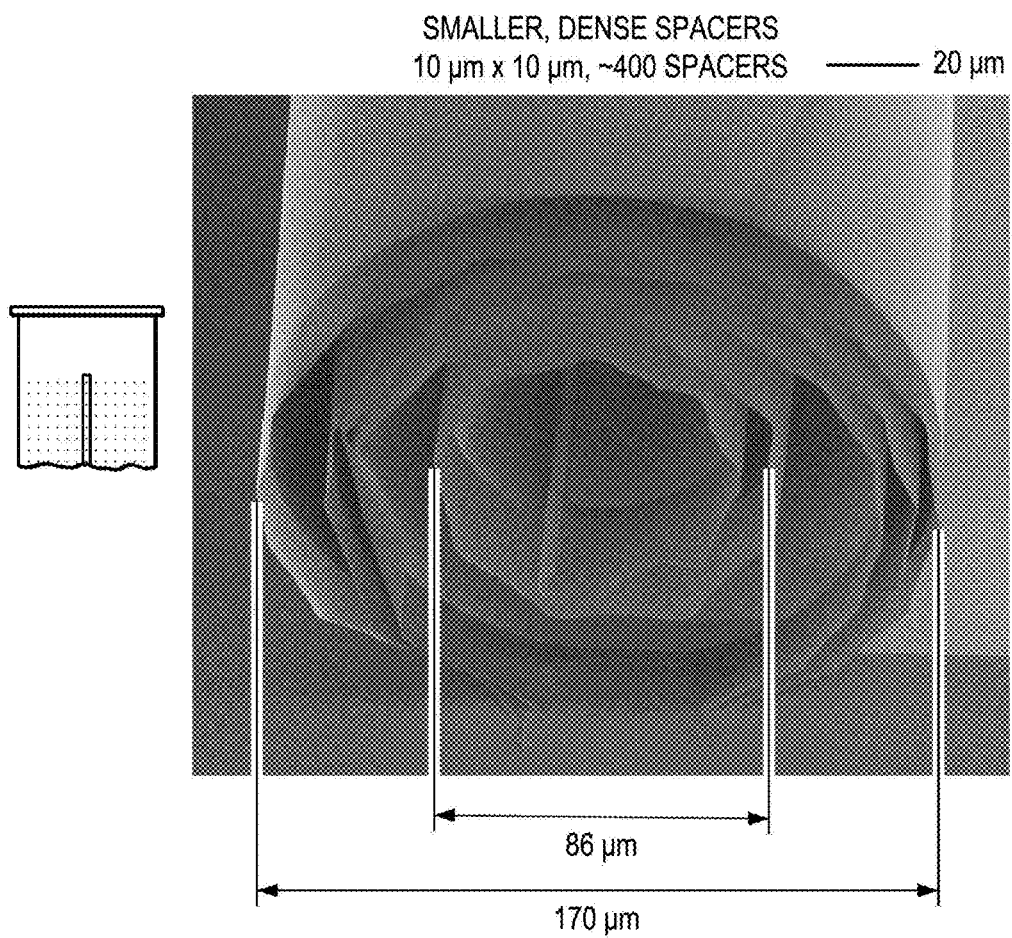
Figure 10B:
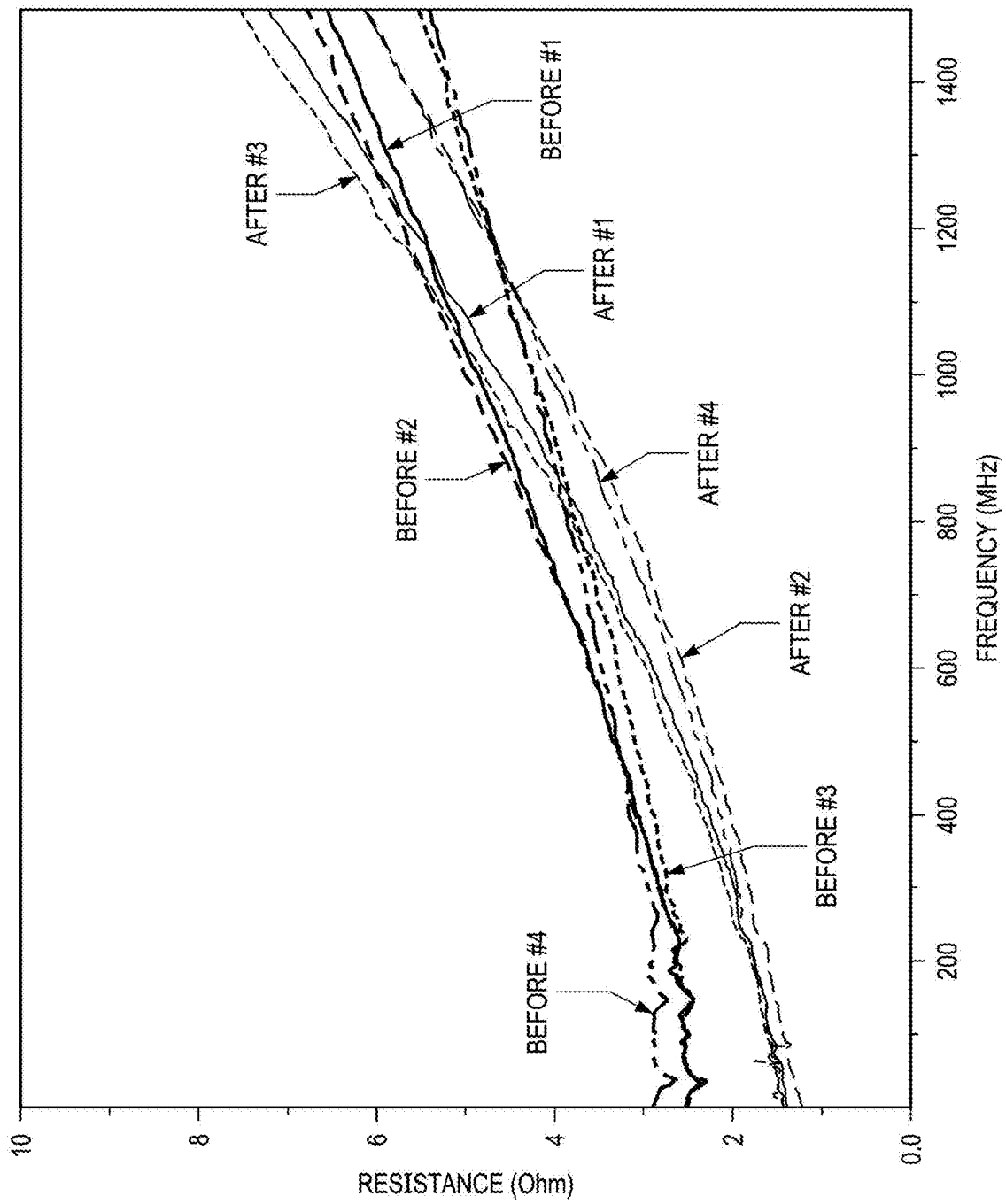
Figure 10F:
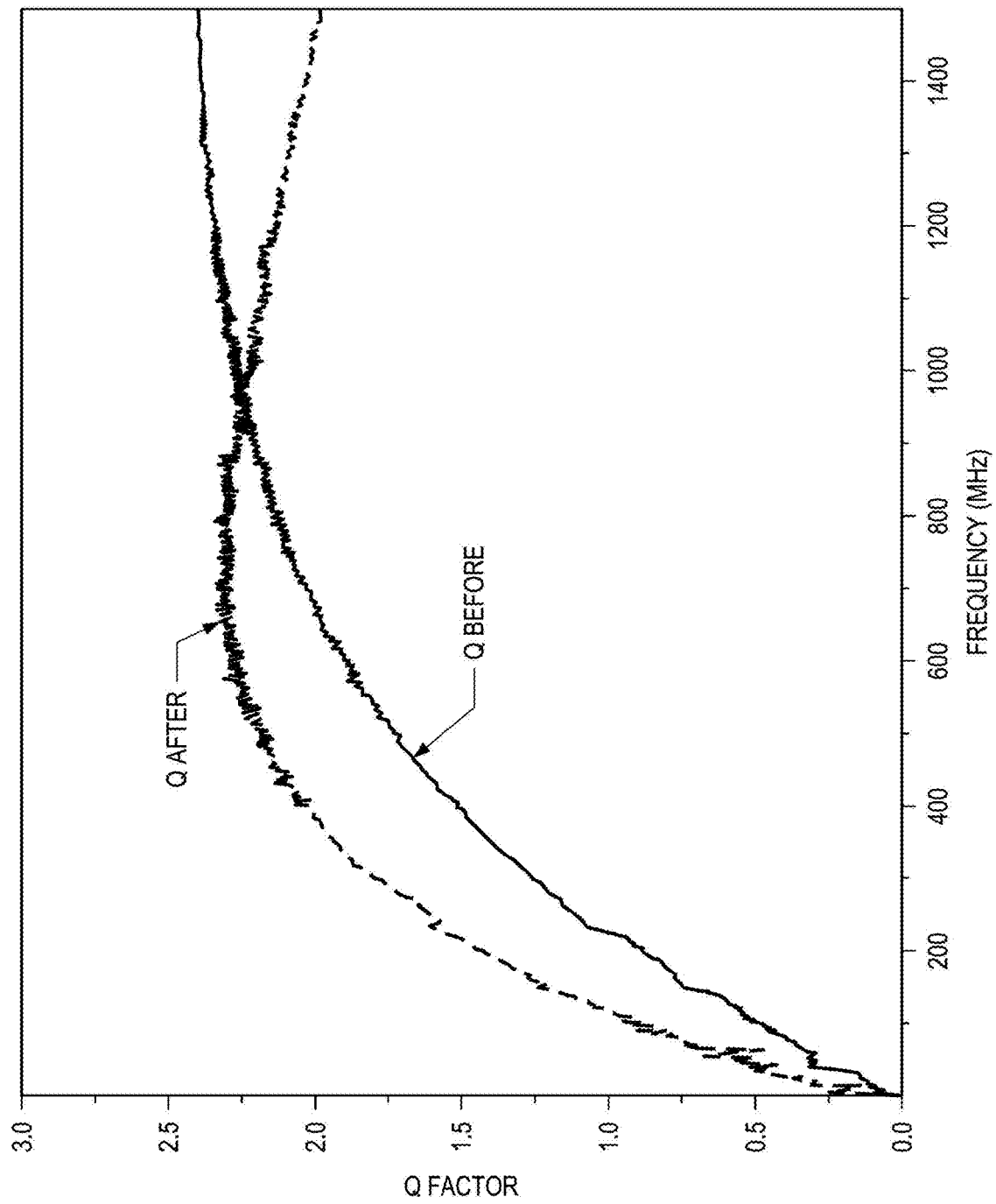

As shown in FIGS. 1A and 1n FIG. 7, spacers 112 may be formed on the conductive pattern layer 114 to promote gap formation during roll-up and to control rolling speed and uniformity. The conductive pattern layer 114 shown here may correspond to one of those illustrated in FIG. 3, each of which includes two conductive cells or strips 146. The additional rectangular pattern shown below the conductive pattern layer 114 is optional and may be used for post-roll-up RF testing. The spacers 112 may function to slow down the rolling process, where larger or more dense spacers 112 may yield bigger gaps. The spacers 112 typically have a height smaller than the size (radial size or thickness) of the gaps, since they are not required to prop up the turns 106 of the multilayer strip 104. The spacers 112 typically have a cuboid or a rectangular cuboid shape, where spacers having the latter shape may be referred to as line spacers. The width, length, height, weight and/or pitch of the spacers 112 may be controlled as desired to influence roll-up and the structure of the resulting rolled-up electronic component. The spacers 112 may be arranged in a one- or two-dimensional array and/or may have a linear or logarithmic spatial distribution. FIGS. 8A-8F show scanning electron microscope images (1.5 k× magnification) of rolled-up passive components formed with line spacers of different widths (10, 30 and 50 microns wide) and linear or logarithmic distributions on 400 nm-thick conductive pattern layers comprising copper. In this example, the spacers are formed of copper, but other materials that may be deposited and lithographically patterned, and which are compatible with the electroplating solution, may be employed. FIGS. 9A-9C show the impact of cuboidal spacers of varying sizes and array densities, as illustrated in the image insets, on roll-up. All of the images of FIGS. 8A-8F and 9A-9C are obtained prior to electroplating.

For rolled-up passive components in which up to 800 nm of copper is plated onto copper conductive pattern layers of about 160 nm in thickness, where the gap size is estimated to be 300-400 nm, the DC resistance of the components is observed to decrease by about 2.5 times after plating. Values of DC resistance ranging from 0.75-1.07Ω are obtained for electroplated samples rolled up using various spacer sizes and arrangements, compared to 1.20-1.23Ω for electroplated samples rolled up without spacers, and to 2.38Ω for an unplated control sample.

A benefit of larger spacers is that the plating solution can better penetrate the turns of the rolled-up components under the same plating conditions, allowing for better and thicker plating and consequently decreased values of resistance. Tables 1 and 2 show DC resistance measurements for rolled-up components prepared from copper-patterned aluminum nitride and silicon nitride strained layers, respectively, rolled up with line spacers of different widths (10 μm, 30 μm and 50 μm) and spatial distributions (linear or logarithmic), and then plated with a copper layer (1.5 or 1.7 microns in thickness). Both sets of data show a similar trend, where the largest spacers lead to a decrease in resistance of about 4 to about 5 times compared to the plated components rolled up without spacers. A trade-off is that inductance is generally lower for rolled-up components prepared using larger spacers since the components tend to include fewer turns and less coupling.

TABLE 1

Resistance Data from AlN-Based Rolled-up Components

| Sample Name | Description | DC Resistance |
|---|---|---|
| LR1C3 | Control, not plated | 2.05 Ω |
| R5C5 | Plated, no spacer | 0.64 Ω |
| R1C8 | Plated with spacer (50 log) | 0.15 Ω |
| R1C9 | Plated with spacer (50 log) | 0.16 Ω |
| R1C10 | Plated with spacer (50 log) | 0.13 Ω |
| R2C7 | Plated with spacer (30 lin) | 0.30 Ω |
| R2C8 | Plated with spacer (30 lin) | 0.26 Ω |
| R3C7 | Plated with spacer (30 log) | 0.38 Ω |
| R3C9 | Plated with spacer (30 log) | 0.43 Ω |
| R4C8 | Plated with spacer (10 lin) | 0.43 Ω |
| R4C9 | Plated with spacer (10 lin) | 0.46 Ω |
| R4C10 | Plated with spacer (10 lin) | 0.42 Ω |
| R5C10 | Plated with spacer (10 log) | 0.41 Ω |

TABLE 2

Resistance Data from SiN$_x$-Based Rolled-up Components

| Sample Name | Description | DC Resistance |
|---|---|---|
| LR1C5 | Control, not plated | 1.86 Ω |
| R1C5 | Plated, no spacer | 0.54 Ω |
| R5C5 | Plated, no spacer | 0.66 Ω |
| R1C7 | Plated with spacer (50 log) | 0.17 Ω |
| R2C9 | Plated with spacer (30 lin) | 0.20 Ω |
| R3C10 | Plated with spacer (30 log) | 0.20 Ω |
| R4C9 | Plated with spacer (10 lin) | 0.32 Ω |
| R4C10 | Plated with spacer (10 lin) | 0.29 Ω |
| R4C10 | Plated with spacer (10 lin) | 0.37 Ω |
| R5C10 | Plated with spacer (10 log) | 0.40 Ω |

Radiofrequency data, including plots of inductance, resistance and Q factor as a function of frequency, are shown in FIGS. 10A-10F for four rolled-up passive components before and after electroplating. The rolled-up passive components include a strain-relieved layer comprising aluminum nitride and a conductive pattern layer comprising copper, with an additional thickness of copper deposited into the gaps by electroplating. The data suggest that some or all of the rolled-up passive components 102 in the array 100 may exhibit, when compared to non-electroplated but otherwise identically-fabricated control samples, an increase in quality factor (Q) at frequencies up to about 900 MHz, a decrease in resistance at frequencies up to about 1100 MHz, and/or an increase in inductance at frequencies up to about 300 MHz compared to the control samples. Also or alternatively, some or all of the rolled-up passive components in the array exhibit a DC resistance of about 1.0Ω or less. In some examples, the DC resistance may be 0.2Ω or less (e.g., in a range from about 0.13 to about 0.20Ω), as shown above.

Figure 11A:
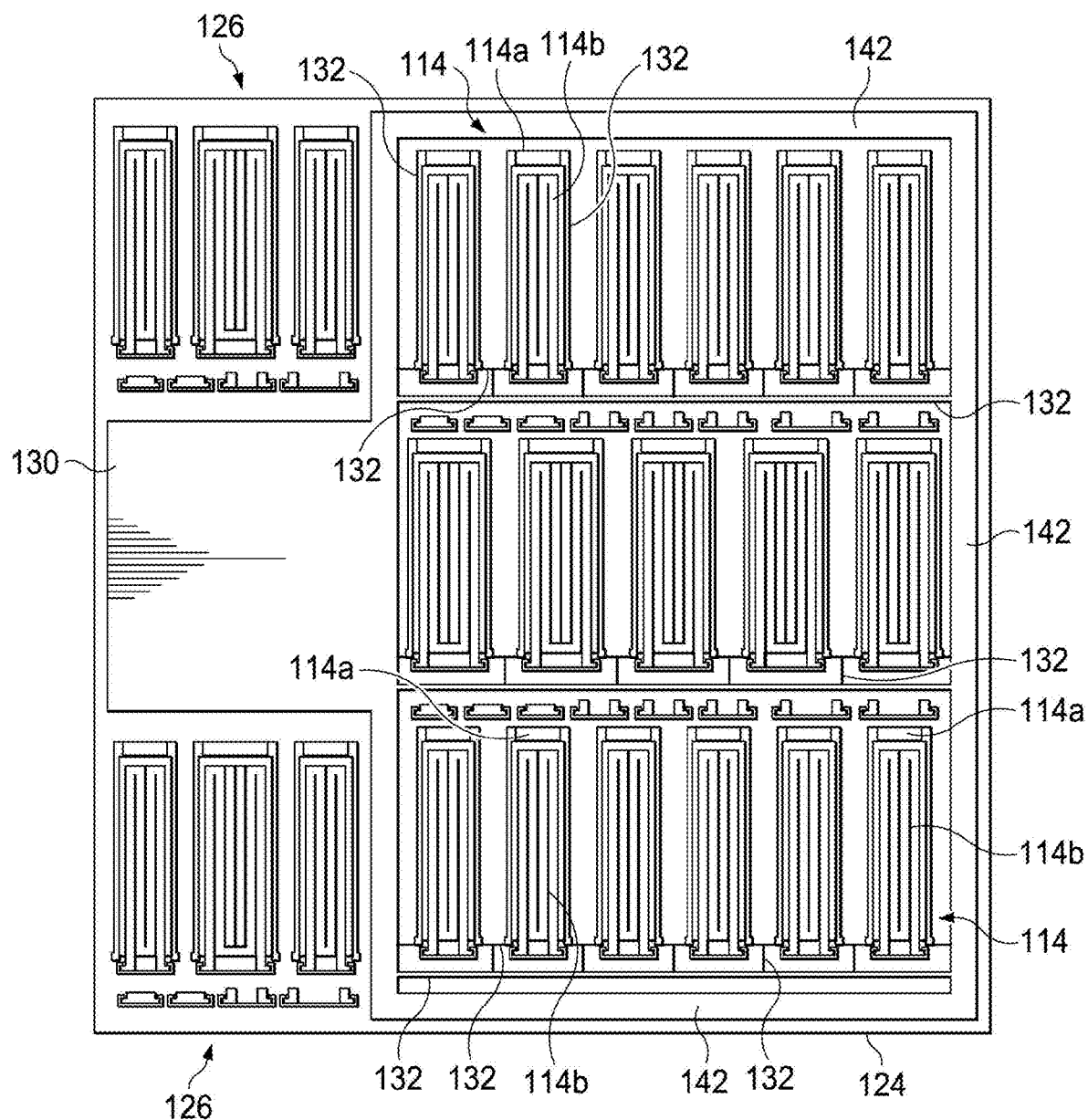
FIG. 11A shows another exemplary lithographic mask design for selective electroplating of the rolled-up passive components.
Figure 11B:
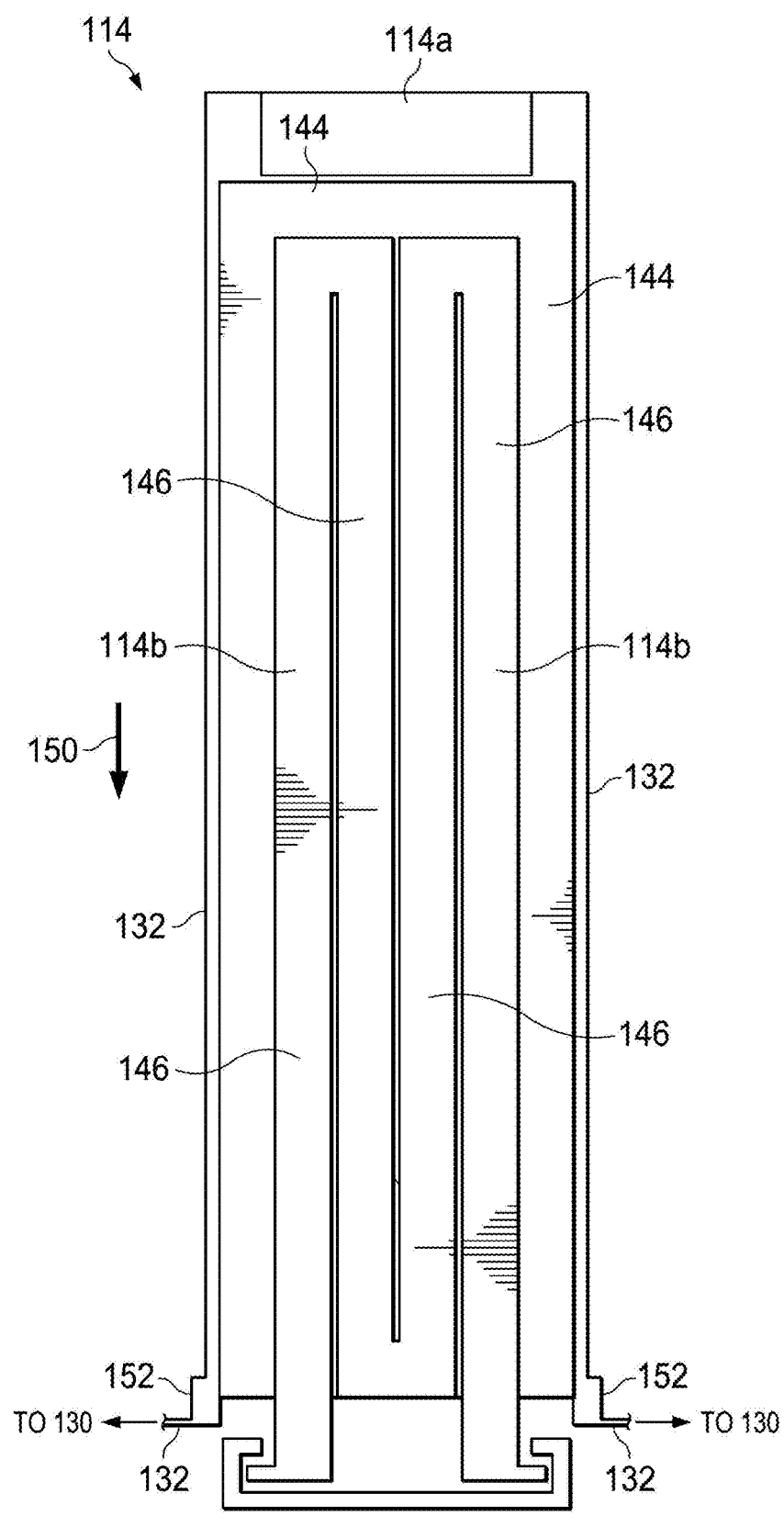
FIG. 11B shows a close-up view of one of the conductive pattern layers.

A mask design intended to enhance the inductance of the rolled-up components by improving electroplating within the cores 110 of the rolled-up components 102 is shown in FIGS. 11A and 11B. This mask design is similar to that shown in FIG. 5, in that only the first portion 114a of the conductive pattern layer 114 at the release end of the multilayer strip—which rolls up to define the core 108—is electrically connected by contact lines 132 to the global contact 130. The second portion 114b of the conductive pattern layer 114, which is positioned away from the release end, is electrically isolated from the global contact 130. After roll-up to form the components 102, the first portion 114a of the conductive pattern layer 114 surrounds the core 110 (e.g., see FIG. 1C) so as to promote electroplating selectively within the core 110 when the global contact 130 is electrically connected to a power source. As shown in FIGS. 11A and 11B, the mask design may include a larger spacing 144 (e.g., about 200 μm to about 400 μm) separating the first portion 114a from the second portion 114b to improve the electrical isolation compared to the FIG. 3 design and to reduce the possibility of a short circuit. Also, a larger (wider) surrounding pad 142 may be incorporated as part of the global contact 130 to ensure consistent plating current. In this and other mask designs, a small stub of metal 152 may be added at the lower corners of each of the conductive pattern layers 114 to inhibit detouring during roll-up (prior to electroplating), which may cause device breakage. In the example of FIG. 11B, the conductive pattern layer 114 includes four conductive strips or cells 146; however, the conductive pattern layer 114 could alternatively include any even number of conductive cells, such as from two to ten cells. Notably, an inductance improvement of up to 450% has been demonstrated for rolled-up components 102 selectively electroplated using this mask design (compared to non-electroplated rolled-up components), even without completely filling the cores 110 with a soft magnetic material. For example, such improvements in inductance may be obtained by selectively electroplating a 3-micron-thick permalloy layer in a core having a 70-micron diameter.

Figure 12B:
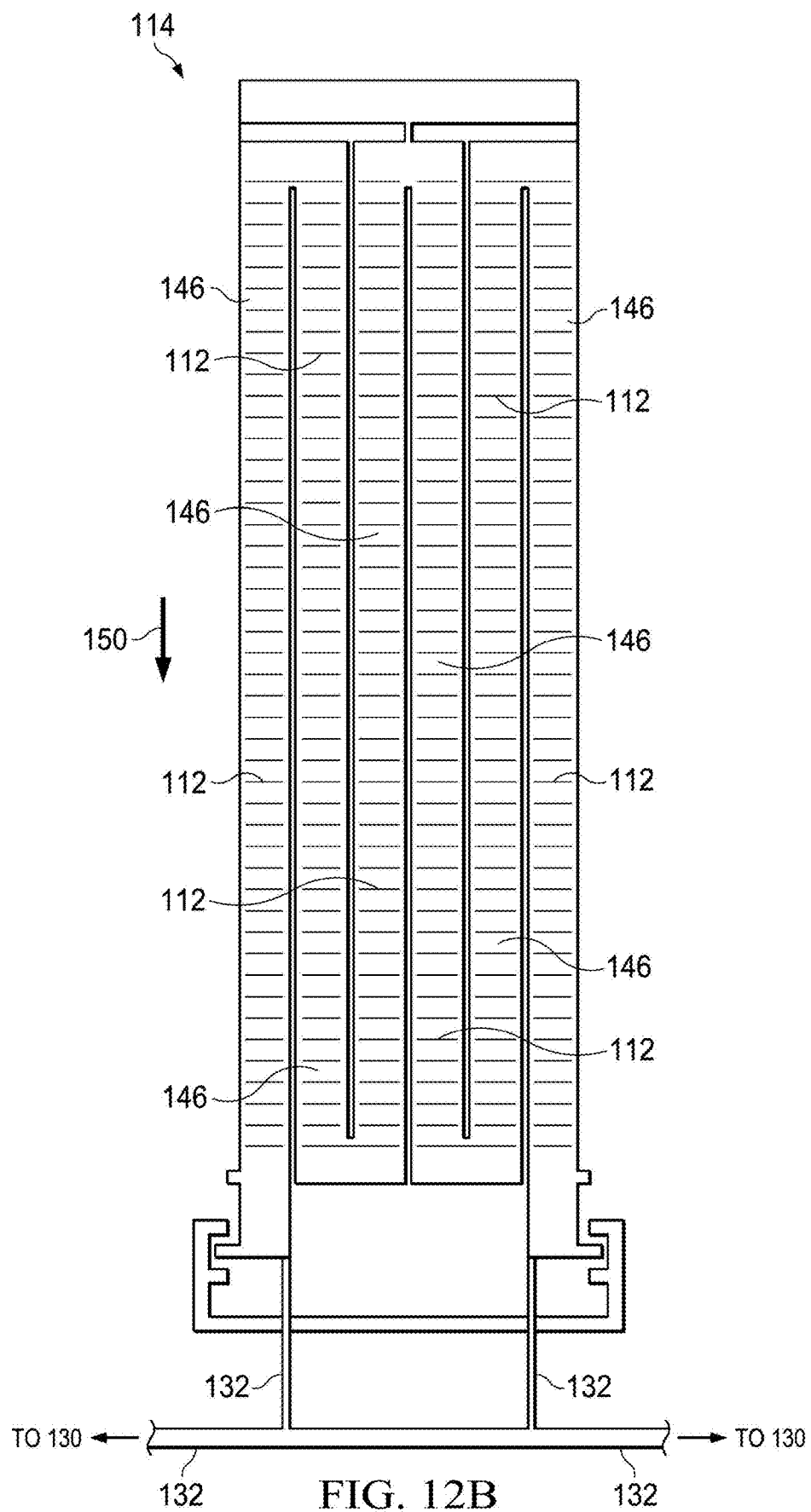
FIG. 12B shows a close-up view of one of the conductive pattern layers.

FIGS. 12A and 12B show a mask design that integrates core and gap plating, analogous to the mask design shown in FIG. 3. FIG. 12A shows a pre-roll-up top-down view of the conductive pattern layer 114 of each rolled-up component, where a top end of each conductive pattern layer 114 corresponds to a release end of the multilayer strip, as in the previous mask designs, and the rolling direction 150 to form the rolled-up components 102 is shown by the downward arrow. The conductive pattern layer 114 of each of the rolled-up components 102 is electrically connected to a global contact 130 on the substrate 124 via contact lines 132. The conductive pattern layer is electrically continuous over the entire rolling length, such that the entire conductive pattern layer 114, and thus both the core 110 and the gaps 108 of each rolled-up component 102, may undergo plating simultaneously, as illustrated by the component 102 of FIG. 1B. Each of the conductive pattern layers 114 may comprise four or more conductive cells or strips 146 (although any number from two to ten may be feasible) and a large number of spacers 112, which may be particularly advantageous for controlling roll-up at longer lengths. A protection layer (e.g., comprising a polymer such as photoresist and/or poly(methyl methacrylate) (PMMA)) may overlie the contact pad 130. The mask design may include a larger (wider) surrounding pad 142 as part of the global contact 130 to ensure consistent plating current. As in previous examples, the substrate 124 may further include control samples 126 that are not intended to undergo electroplating and which are not electrically connected to the global contact 130.

Advantages of employing a single global contact 130 instead of two, as described above in regard to FIG. 6, may include fewer contact lines 132 on the substrate 124 and avoidance of possible issues with electrical isolation and short circuit plating. Using the mask design shown in FIG. 12A, multiple functional materials may be deposited in separate electroplating steps. For example, one or more layers of an electrically conductive material such as copper may be plated alternately with one or more layers of a soft magnetic material such as permalloy. Because the entire conductive pattern layer 114 is electrically connected to the global contact 130, both the electrically conductive material and the soft magnetic material may be plated into both the gaps 108 and the cores 110 of the rolled-up components 102.

Example 1: Copper Electroplating

Copper electroplating experiments are carried out in a custom-made electroplating set-up, which is shown schematically in FIG. 4. A substrate (a two-inch sapphire wafer in this example) including rolled-up components is mounted on a connecting pin and immersed in an electroplating bath. Electrical contact with the conductive pattern layer is provided by a rectangular contact pad. An aqueous copper sulfate-based electrolyte (hi-speed bright Cu; Sigma Aldrich) is used. The electrolyte bath may also contain hydrochloric acid, sulfuric acid and/or organic additives such as accelerators, levelers and suppressors. These organic additives may assist with high-aspect ratio plating and allow the copper ions to penetrate into intricate areas. For a long plating process, suppressor and leveler molecules may adsorb on side walls where they minimize the risk of forming voids by checking overburdening supply of copper ions. A copper sacrificial electrode (99% purity) may be used as an anode to supply copper ions into the electroplating solution. The dimensions of the anode are modified to ensure overlap with the entire substrate to maintain parallel diffusion lengths. In addition, the distance between the anode and the substrate is minimized to ease the copper ion access. A pulse rectifier potentiostat (VSP-3e) is used for pulsed constant current electroplating. Three important requirements dictate the plating parameters: plating thickness (2-4 μm in this example), uniformity (low edge effects) and morphology (low resistivity). As discussed above, pulsed plating may be advantageous. A typical pulsed plating recipe may include a pulsed current of 1-10 mA (e.g., 4 mA), with a pulse on time ($t_{on}$) of 5 s and a pulse off time ($t_{off}$) of 2 s. An electroplated copper step profile (~2 microns) shows uniformity (low edge effects) after 500 cycles of pulsed plating.

Example 2: Permalloy Electroplating

In another electroplating example, a ferromagnetic magnetic material, permalloy (80% Ni, 20% Fe), is electroplated inside the cores of the rolled-up components using a two-electrode custom-made electrochemical cell as described above. A commercially available permalloy electroplating solution is used. The solution may include Ni—Fe based salts (nickel(II) sulfamate tetrahydrate, nickel bromide, ferrous sulfate), boric acid and other stress reducing, wetting and stabilizing agents. A sufficiently large area anode (e.g., a platinum anode) is placed parallel to the target substrate (cathode) at a distance of 1.5 cm inside the electroplating solution. To obtain the desired $Ni_{80}Fe_{20}$ stoichiometry it may be important to operate within the range of 13-15 mA/cm². Seed layer area on the substrate is engineered to ensure plating remains within the preferred current density range (13-15 mA/cm²). Pulsed constant current plating is used for similar reasons as explained above. Sufficient turbulence is introduced to make-up for the lack of accelerating additives in the solution. Turbulence enhances the ease of Fe—Ni ion access into the cores of the rolled-up components and may simultaneously help in diffusing-off hydrogen bubbles, preventing void formation. The electroplating may be carried out at room temperature. In one example, the room temperature plating may include: 180 nm gold seed layer, current 16 mA, plating area (mask design), 4 on/6 off, 1000 cycles, 450 rpm of stirring rate (turbulence), ~4 μm thickness (permalloy).

The disclosures of U.S. Pat. No. 9,224,532, entitled "Rolled-up Inductor Structure for a Radiofrequency Integrated Circuit (RFIC)," U.S. Pat. No. 9,330,829, entitled "Rolled-up Transformer Structure for a Radiofrequency Integrated Circuit (RFIC)," U.S. Pat. No. 10,003,317, entitled "Tubular Resonant Filter and Method of Making a Tubular Resonant Filter," U.S. Pat. No. 10,490,328, entitled "Rolled-Up Power Inductor and Array of Rolled-Up Power Inductors for On-Chip Applications," and U.S. Patent Application Publication 2019/0378890, entitled "Rolled-up Electromagnetic Component for On-Chip applications and Method of Making a Rolled-up Electromagnetic Component" are hereby incorporated by reference in their entirety.

Although considerable detail with reference to certain embodiments has been described, other embodiments are possible. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages, and it is not necessarily expected that all of the described advantages will be achieved with every embodiment.

The invention claimed is:

1. An electroplating method for enhancing a performance of rolled-up passive components, the method comprising:
   providing an array of the rolled-up passive components on a substrate, each rolled-up passive component comprising a multilayer strip in a rolled configuration including multiple turns spaced apart by gaps, a core of each rolled-up passive component being defined by a first of the multiple turns, the multilayer strip comprising a conductive pattern layer on a strain-relieved layer; and
   electroplating a layer comprising a functional material onto the conductive pattern layer of each rolled-up passive component, thereby at least partly filling the gaps and/or the core with the functional material.

2. The method of claim 1, wherein the electroplating is carried out more than once to electroplate multiple layers and/or different functional materials onto the conductive pattern layer.

3. The method of claim 1, wherein the functional material comprises an electrically conductive material, a soft magnetic material, a sensing material, an optomechanical material, a piezoelectric material, and/or another material capable of being electroplated.

4. The method of claim 1, wherein the functional material comprises an electrically conductive material, and
   wherein the conductive pattern layer comprises the same electrically conductive material, the electroplating thereby increasing a thickness of the conductive pattern layer.

5. The method of claim 1, wherein the functional material comprises a soft magnetic material, and
   wherein only the core is partly or completely filled with the soft magnetic material.

6. The method of claim 1, wherein each of the rolled-up passive components further comprises spacers in the gaps, the spacers having a height smaller than a size of the gaps.

7. The method of claim 6, wherein the spacers have a cuboid or a rectangular cuboid shape.

8. The method of claim 1, wherein the electroplating is carried out using a pulsed current, a constant current, or a constant voltage.

9. The method of claim 1, wherein a thickness of the layer is controlled by a time duration of the electroplating.

10. The method of claim 1, wherein the electroplating is carried out more than once to electroplate multiple layers onto the conductive pattern layer, each of the multiple layers comprising a soft magnetic material or an electrically conductive material, thereby at least partly filling the gaps and the core with the soft magnetic material and the electrically conductive material.

11. The method of claim 1, wherein the conductive pattern layer of each rolled-up passive component is electrically connected to a global contact on the substrate.

12. The method of claim 11, wherein the electroplating comprises:
   immersing the substrate comprising the array of rolled-up passive components into an electroplating bath comprising an electroplating solution and an electrode, the substrate and the electrode being spaced apart from each other; and
   electrically connecting the electrode and the global contact to a power source.

13. The method of claim 12, further comprising stirring, mixing and/or agitating the electroplating solution to promote penetration into the cores and the gaps of the rolled-up passive components.

14. The method of claim 11, wherein, for some or all of the rolled-up passive components, a first portion of the conductive pattern layer is electrically connected to the global contact on the substrate for electroplating selectively onto the first portion, and
   wherein a second portion of the conductive pattern layer is electrically isolated from the global contact.

15. The method of claim 14, wherein the global contact is a first global contact, and further comprising a second global contact on the substrate,
   wherein the second portion of the conductive pattern layer is electrically connected to the second global contact for electroplating selectively onto the second portion in a separate electroplating step.

16. The method of claim 15, wherein the second separate electroplating step comprises:
   immersing the substrate comprising the array of rolled-up passive components into a second electroplating bath comprising a second electroplating solution and an electrode, the substrate and the electrode being spaced apart from each other; and
   electrically connecting the electrode and the second global contact to a power source.

17. The method of claim 3, wherein the electrically conductive material is selected from the group consisting of: carbon, silver, gold, aluminum, cobalt, copper, molybdenum, nickel, palladium, platinum, ruthenium, titanium, titanium nitride, tungsten, and zinc, and
   wherein the soft magnetic material comprises iron, nickel, chromium, iron oxide, a ferrite, iron nitride, manganese selenide, a nickel-iron alloy, and/or an iron-silicon-aluminum alloy.

18. The method of claim 1, wherein the strain-relieved layer comprises aluminum nitride or silicon nitride, and
   wherein the conductive pattern layer comprises an electrically conductive material selected from the group consisting of: carbon, silver, gold, aluminum, cobalt, copper, molybdenum, nickel, palladium, platinum, ruthenium, titanium, titanium nitride, tungsten, and zinc.

19. The method of claim 1, wherein, after the electroplating, some or all of the rolled-up passive components in the array comprise:
   an increase in quality factor (Q) at frequencies up to about 900 MHZ,
   a decrease in resistance at frequencies up to about 1100 MHZ, and/or
   an increase in inductance at frequencies up to about 300 MHz,
   compared to non-electroplated control samples.

20. The method of claim 1, wherein, after the electroplating, some or all of the rolled-up passive components in the array comprise a DC resistance of about 1.0Ω or less.